(12) United States Patent
Park et al.

(10) Patent No.: US 9,397,052 B2
(45) Date of Patent: Jul. 19, 2016

(54) SEMICONDUCTOR PACKAGE

(71) Applicant: SAMSUNG ELECTRONICS CO., LTD., Suwon-si (KR)

(72) Inventors: Soojae Park, Seongnam-si (KR); Hyunsuk Chun, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1 day.

(21) Appl. No.: 14/291,698

(22) Filed: May 30, 2014

(65) Prior Publication Data
US 2015/0048522 A1 Feb. 19, 2015

(30) Foreign Application Priority Data

Aug. 14, 2013 (KR) ........................ 10-2013-0096574

(51) Int. Cl.
*H01L 23/49* (2006.01)
*H01L 23/52* (2006.01)
(Continued)

(52) U.S. Cl.
CPC .............. *H01L 23/562* (2013.01); *H01L 23/16* (2013.01); *H01L 25/0657* (2013.01); *H01L 23/3121* (2013.01); *H01L 24/05* (2013.01); *H01L 24/06* (2013.01); *H01L 24/13* (2013.01); *H01L 24/14* (2013.01); *H01L 24/16* (2013.01); *H01L 24/32* (2013.01); *H01L 24/48* (2013.01); *H01L 24/49* (2013.01); *H01L 24/73* (2013.01); *H01L 24/92* (2013.01); *H01L 25/50* (2013.01);
(Continued)

(58) Field of Classification Search
CPC ... H01L 23/562; H01L 23/16; H01L 25/0657; H01L 24/92; H01L 24/06; H01L 2224/04042; H01L 24/48; H01L 2224/0401; H01L 2224/92125; H01L 24/05; H01L 24/49; H01L 2224/06181; H01L 2224/05009; H01L 2224/06135; H01L 24/14; H01L 24/13; H01L 2224/92247; H01L 24/32; H01L 2224/131; H01L 25/50; H01L 2224/49175; H01L 24/73; H01L 24/16; H01L 2224/48091; H01L 2224/22; H01L 2224/73265; H01L 2224/32225; H01L 2224/48227; H01L 2924/00012; H01L 2224/32145; H01L 2924/014; H01L 2924/00; H01L 2224/73204; H01L 2224/16225

See application file for complete search history.

(56) References Cited

U.S. PATENT DOCUMENTS 6,265,772 B1 * 7/2001 Yoshida .............. H01L 23/3677
257/712
6,459,144 B1 10/2002 Pu et al.
(Continued)

FOREIGN PATENT DOCUMENTS

JP 2005-353679 A 12/2005

OTHER PUBLICATIONS

Zhai, C.J. et al., "Investigation of Cu/Low-k Film Delamination in Flip Chip Packages," IEEE Electronic Components and Technology Conference, 2006, pp. 709 to 717.
(Continued)

*Primary Examiner* — Victor A Mandala
(74) *Attorney, Agent, or Firm* — Sughrue Mion, PLLC

(57) ABSTRACT

A semiconductor package includes a package substrate, a first semiconductor chip mounted on the package substrate, a second semiconductor chip mounted on the first semiconductor chip to expose at least a portion of the first semiconductor chip, and a stress-relieving structure provided at an edge of the first semiconductor chip and configured to relieve stress applied between the first semiconductor chip and the second semiconductor chip.

17 Claims, 35 Drawing Sheets

(51) Int. Cl.
*H01L 29/40* (2006.01)
*H01L 23/00* (2006.01)
*H01L 25/065* (2006.01)
*H01L 23/16* (2006.01)
*H01L 23/31* (2006.01)
*H01L 25/00* (2006.01)

(52) U.S. Cl.
CPC ............ *H01L2224/0401* (2013.01); *H01L 2224/04042* (2013.01); *H01L 2224/05009* (2013.01); *H01L 2224/06135* (2013.01); *H01L 2224/06181* (2013.01); *H01L 2224/131* (2013.01); *H01L 2224/13025* (2013.01); *H01L 2224/14181* (2013.01); *H01L 2224/16146* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/49175* (2013.01); *H01L 2224/73204* (2013.01); *H01L 2224/73257* (2013.01); *H01L 2224/73265* (2013.01); *H01L 2224/92125* (2013.01); *H01L 2224/92247* (2013.01); *H01L 2225/0651* (2013.01); *H01L 2225/06513* (2013.01); *H01L 2225/06517* (2013.01); *H01L 2225/06541* (2013.01); *H01L 2225/06562* (2013.01); *H01L 2225/06568* (2013.01); *H01L 2924/181* (2013.01)

(56) References Cited

U.S. PATENT DOCUMENTS

| | | |
|---|---|---|
| 6,570,245 B1 | 5/2003 | Ma |
| 6,930,378 B1 * | 8/2005 | St. Amand .......... H01L 25/0657 257/685 |
| 7,078,264 B2 | 7/2006 | Yang |
| 7,148,560 B2 | 12/2006 | Lee et al. |
| 7,166,924 B2 * | 1/2007 | Lu ........................... H01L 24/32 257/777 |
| 7,256,503 B2 | 8/2007 | Daubenspeck et al. |
| 7,944,049 B2 | 5/2011 | Fujii |
| 8,207,620 B2 | 6/2012 | Tzeng et al. |
| 8,270,620 B2 | 9/2012 | Christensen |
| 9,129,826 B2 * | 9/2015 | Lee ........................ H01L 24/32 |
| 9,144,973 B2 * | 9/2015 | Cruz-Uribe .............. B41J 2/045 |
| 2005/0156323 A1 * | 7/2005 | Tokunaga ............... H01L 23/13 257/778 |
| 2006/0071317 A1 * | 4/2006 | Kang ..................... H01L 24/32 257/686 |
| 2006/0267609 A1 * | 11/2006 | Lee ........................ H01L 24/32 257/686 |
| 2007/0001296 A1 * | 1/2007 | Lee ....................... H01L 23/562 257/723 |
| 2008/0203564 A1 | 8/2008 | Motoyoshi et al. |
| 2009/0152683 A1 | 6/2009 | Nguyen et al. |
| 2011/0248398 A1 | 10/2011 | Parvarandeh et al. |
| 2012/0049351 A1 | 3/2012 | Lee |
| 2012/0074519 A1 | 3/2012 | Yeo et al. |
| 2013/0093103 A1 * | 4/2013 | Kim ..................... H01L 25/0657 257/777 |
| 2014/0057391 A1 * | 2/2014 | Lin ......................... H01L 21/56 438/107 |

OTHER PUBLICATIONS

Park, Soojae et al., "Crack Growth Rate of Thermally Induced Underfill Fatigue," IEEE Electronic Components and Technology Conference, 2009, pp. 1240 to 1244.

* cited by examiner

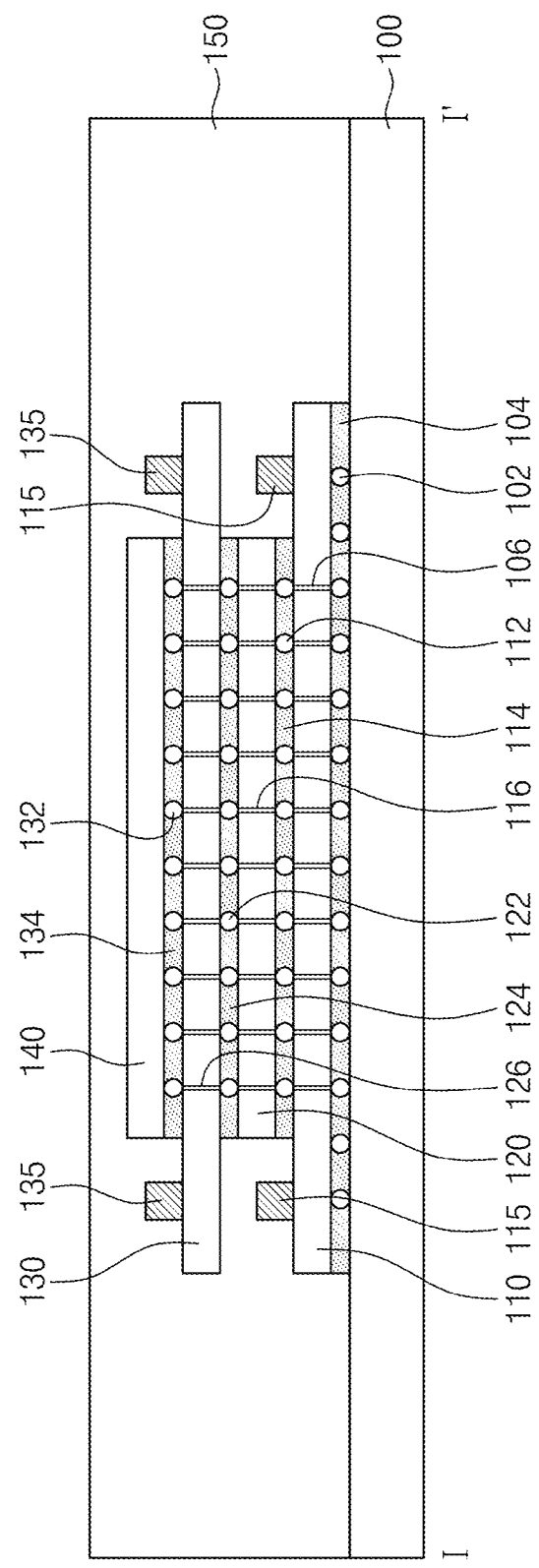

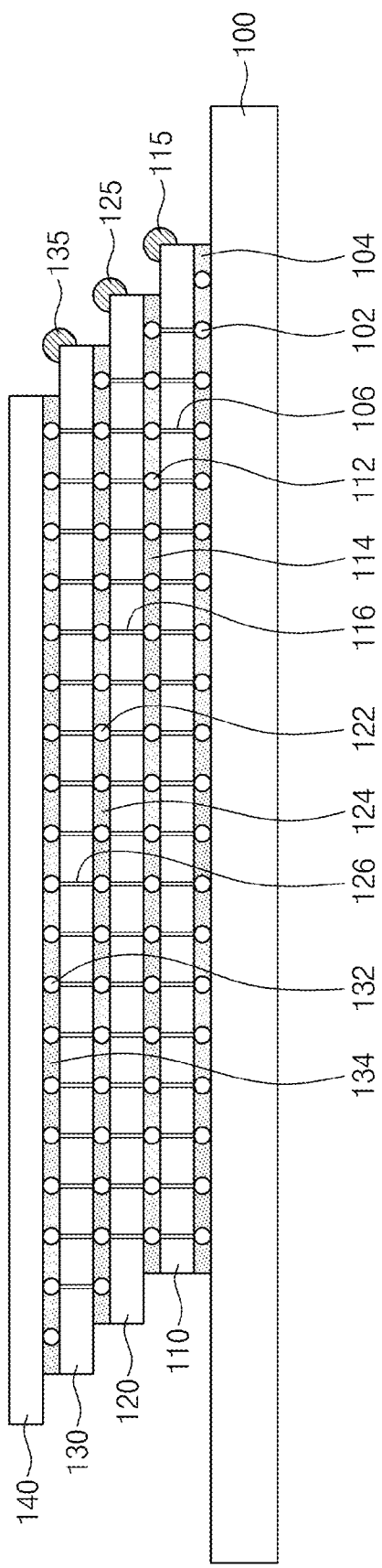

SEMICONDUCTOR PACKAGE

CROSS-REFERENCE TO RELATED APPLICATIONS

This application claims priority from Korean Patent Application No. 10-2013-0096574, filed on Aug. 14, 2013 in the Korean Intellectual Property Office, the entire contents of which are hereby incorporated by reference.

BACKGROUND

Apparatuses and articles of manufacture consistent with exemplary embodiments relate to a semiconductor package, and in particular, to a semiconductor package including a plurality of vertically-stacked semiconductor chips.

Due to their small-size, multi-functionality, and/or low-cost characteristics, semiconductor devices are considered important elements in the electronic industry. The semiconductor devices can be generally classified into a memory device for storing data, a logic device for processing data, and a hybrid device capable of performing various memory storage and data processing functions simultaneously.

Higher integration of semiconductor devices is required to satisfy consumer demands for electronic devices with fast speed. However, owing to several technical issues associated with a fabrication process, it is becoming harder to realize the highly-integrated semiconductor devices. To overcome such limitations, there have been a variety of studies on new technology for increasing an integration density of the semiconductor device.

SUMMARY

One or more exemplary embodiments provide to a semiconductor package with high density and/or high speed.

According to an aspect of an exemplary embodiment, there is provided a semiconductor package including a package substrate, a first semiconductor chip mounted on the package substrate, a second semiconductor chip mounted on the first semiconductor chip to expose at least a portion of the first semiconductor chip, and a stress-relieving structure provided at an edge of the first semiconductor chip and configured to relieve stress applied between the first semiconductor chip and the second semiconductor chip.

The stress-relieving structure may include at least one of epoxy resin, polyimide, silicone, or rubber.

The semiconductor package may further include a third semiconductor chip mounted on the second semiconductor chip and overlapped with the stress-relieving structure.

The stress-relieving structure may be provided on a portion of the first semiconductor chip exposed by the second semiconductor chip.

At least a portion of the stress-relieving structure may be overlapped with the second semiconductor chip and another portion may be protruded from an edge of the second semiconductor chip.

The stress-relieving structure may be provided below an edge of the second semiconductor chip and may be wholly overlapped with the second semiconductor chip.

The stress-relieving structure may be provided on a corner of the first semiconductor chip to have a structure outwardly protruding from the first semiconductor chip.

The stress-relieving structure may be provided on a corner of the first semiconductor chip exposed by the second semiconductor chip.

The stress-relieving structure may include a line-shaped pattern extending along an edge of the first semiconductor chip exposed by the second semiconductor chip.

The stress-relieving structure may include an 'L'-shaped pattern disposed at a corner at which two sides of the first semiconductor chip exposed by the second semiconductor chip meet.

The semiconductor package may further include connection patterns provided between the first semiconductor chip and the second semiconductor chip to connect the first semiconductor chip and the second semiconductor chip electrically, and an under-fill layer provided between the first semiconductor chip and the second semiconductor chip to cover the connection patterns.

The stress-relieving structure may be provided on the portion of the first semiconductor chip exposed by the second semiconductor chip, and be spaced apart from the under-fill layer.

The stress-relieving structure may be provided in the under-fill layer.

The stress-relieving structure may include at least a portion provided in the under-fill layer and another portion extending outward beyond the second semiconductor chip.

The semiconductor package may further include a mold layer covering the package substrate and the first semiconductor chip and the second semiconductor chip.

BRIEF DESCRIPTION OF THE DRAWINGS

The above and/or other aspects will be more clearly understood from the following detailed description taken in conjunction with the accompanying drawings, in which:

FIG. 10B is a sectional view of the semiconductor package taken along a line I-I' of FIG. 10A;

FIGS. 13A through 13C are sectional views illustrating a method of fabricating a semiconductor package, according to still other exemplary embodiments.

DETAILED DESCRIPTION

Figure 1:
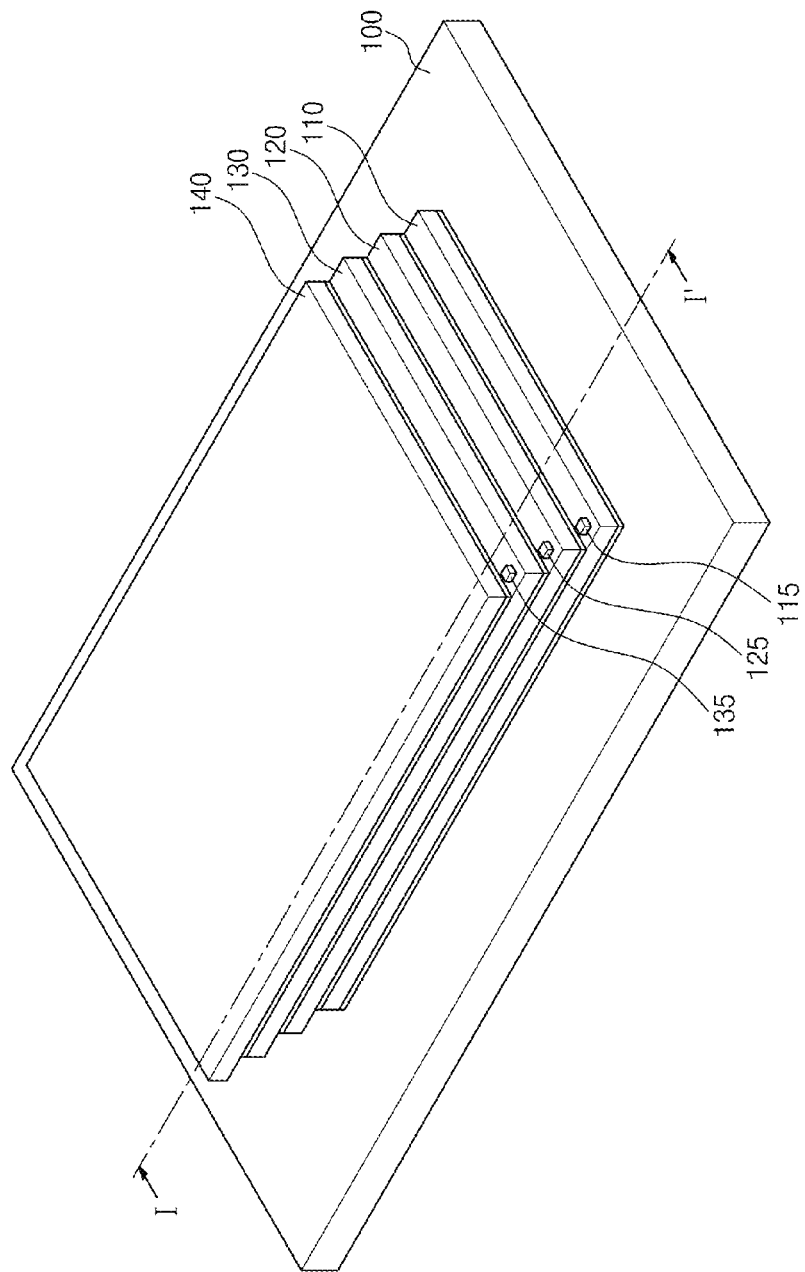
FIG. 1 is a perspective view illustrating a semiconductor package according to exemplary embodiments.

Exemplary embodiments will now be described more fully with reference to the accompanying drawings, in which exemplary embodiments are shown. Exemplary embodiments may, however, be embodied in many different forms and should not be construed as being limited to the exemplary embodiments set forth herein; rather, these exemplary embodiments are provided so that this disclosure will be thorough and complete, and will fully convey the concept of exemplary embodiments to those of ordinary skill in the art. In the drawings, the thicknesses of layers and regions are exaggerated for clarity Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given exemplary embodiment, and should not be interpreted as defining or limiting the range of values or properties encompassed by various exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

FIG. 1 is a perspective view illustrating a semiconductor package according to exemplary embodiments. FIGS. 2A through 2F are sectional views of the semiconductor packages taken along a line I-I' of FIG. 1.

Figure 2A:
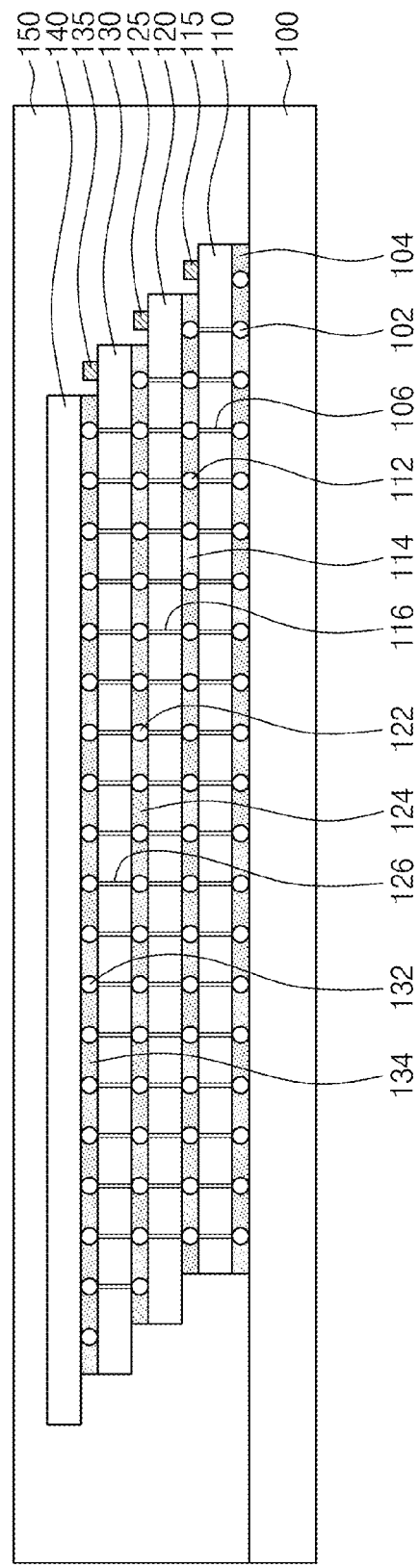
FIGS. 2A through 2F are sectional views of the semiconductor packages taken along a line I-I' of FIG. 1.

Referring to FIGS. 1 and 2A, a semiconductor package may include a package substrate 100, a plurality of semiconductor chips 110, 120, 130, and 140, which are vertically stacked on the package substrate 100, and a mold layer 150 covering the package substrate 100 and the semiconductor chips 110, 120, 130, and 140.

The package substrate 100 may be provided to have a plate structure and include wiring patterns. For example, the wiring patterns may be formed on a top surface of the package substrate 100. Alternatively, the wiring patterns may be formed on top and bottom surfaces of the package substrate 100. The package substrate 100 may be a printed circuit board, a tape wiring substrate, or a ceramic substrate, or the like.

The semiconductor chips 110, 120, 130, and 140 may be vertically stacked on the top surface of the package substrate 100. Each of the plurality of semiconductor chips 110, 120, 130, and 140 may include a memory or logic device integrated on a semiconductor substrate. For example, one (e.g., 110) of the semiconductor chips 110, 120, 130, and 140 may be a FLASH memory chip, a dynamic random access memory (DRAM) chip, or a static random access memory (SRAM) chip, and another (e.g., 120) of the semiconductor chips 110, 120, 130, and 140 may be a memory controller, a processor, or a system-on-chip. The semiconductor substrate may include silicon, germanium, and/or silicon germanium.

According to the present exemplary embodiment, at least two of the semiconductor chips 110, 120, 130, and 140 may be vertically stacked on the package substrate 100 in such a way that an upper one thereof is disposed to expose at least a portion of a lower one thereof.

In the present specification, the inventive concept will be exemplarily described with reference to an example of the semiconductor package including four semiconductor chips 110, 120, 130, and 140. For the sake of description, the four semiconductor chips 110, 120, 130, and 140 will be referred to as a first semiconductor chip 110, a second semiconductor chip 120, a third semiconductor chip 130, and a fourth semiconductor chip 140, according to a stacking order of the semiconductor chips on the package substrate 100.

As shown in FIG. 1, the semiconductor chips 110, 120, 130, and 140 may have substantially the same size or area. The semiconductor chips 110, 120, 130, and 140 may be stacked to form a staircase or cascade structure. In exemplary embodiments, each of the semiconductor chips may be horizontally shifted along a specific direction with respect to an underlying semiconductor chip and be vertically stacked on the underlying semiconductor chip. For example, the first semiconductor chip 110 may be stacked on the package substrate 100, and the second semiconductor chip 120 may be leftward moved with respect to the first semiconductor chip 110 and stacked on the first semiconductor chip 110 to expose a right portion of the first semiconductor chip 110. Similarly, the third semiconductor chip 130 may be leftward moved with respect to the second semiconductor chip 120 and stacked on the second semiconductor chip 120 to expose a right portion of the second semiconductor chip 120, and the fourth semiconductor chip 140 may be leftward moved with respect to the third semiconductor chip 130 and stacked on the third semiconductor chip 130 to expose a right portion of the third semiconductor chip 130.

Referring to FIGS. 2A through 2F, first connection patterns 102 may be provided between the package substrate 100 and the first semiconductor chip 110 to connect electrically the first semiconductor chip 110 to the package substrate 100. At least one of the first connection patterns 102 may include a solder ball. Alternatively each of the first connection patterns 102 may include a solder ball. A first under-fill layer 104 may be provided to protect the first connection patterns 102. Further, the first semiconductor chip 110 may include first vias 106, which may be provided through the first semiconductor chip 110 to connect electrically the second semiconductor chip 120 to the package substrate 100.

Second connection patterns 112 may be provided between the first semiconductor chip 110 and the second semiconductor chip 120 to connect electrically the first semiconductor chip 110 and the second semiconductor chip 120. At least one of the second connection patterns 112 may include a solder ball. Alternatively, each of the second semiconductor patterns 112 may include a solder ball. A second under-fill layer 114 may be provided to protect the second connection patterns 112. Further, the second semiconductor chip 120 may include second vias 116, which may be provided through the second semiconductor chip 120 to connect electrically the first semiconductor chip 110 to the third semiconductor chip 130.

Third connection patterns 122 may be provided between the second semiconductor chip 120 and the third semiconductor chip 130 to connect electrically the second semiconductor chip 120 and the third semiconductor chip 130 to each other. At least one of the third connection patterns 122 may include a solder ball. Alternatively each of the third connection patterns 122 may include a solder ball. A third under-fill layer 124 may be provided to protect the third connection patterns 122. Further, the third semiconductor chip 130 may include third vias 126, which may be provided through the third semiconductor chip 130 to connect electrically the second semiconductor chip 120 to the fourth semiconductor chip 140.

Fourth connection patterns 132 may be provided between the third semiconductor chip 130 and the fourth semiconductor chip 140 to connect electrically the third semiconductor chip 130 and the fourth semiconductor chip 140 to each other. At least one of the fourth connection patterns 132 may include a solder ball. Alternatively, each of the fourth connection patterns 132 may include a solder ball. A fourth under-fill layer 134 may be provided to protect the fourth connection patterns 132.

As shown in FIG. 2A, a first stress-relieving structure 115 may be provided adjacent to the second under-fill layer 114, on the first semiconductor chip 110. The first stress-relieving structure 115 may be disposed spaced apart from the second under-fill layer 114. Further, as shown in FIG. 2A, the first stress-relieving structure 115 is not overlapped with the second semiconductor chip 120, when viewed in plan view. However, this is only an example, and in certain exemplary embodiments, the first stress-relieving structure 115 may be provides so as to overlap with the second semiconductor chip 120, when viewed in plan view.

Similarly, a second stress-relieving structure 125 and a third stress-relieving structure 135 may be provided on the second semiconductor chip 120 and the third semiconductor chip 130, respectively. The second stress-relieving structure 125 and the third stress-relieving structure 135 may be provided in substantially the same manner as the first stress-relieving structure 115, and thus, for the sake of brevity, a description thereof will be omitted.

By providing the first stress-relieving structure 115, the second stress-relieving structure 125, and the third stress-relieving structure 135, it is possible to relieve stress applied to edges of the first to fourth semiconductor chips 110, 120, 130, and 140. For the sake of description, the first stress-relieving structure 115 will be exemplarily described in the following description. In detail, the second semiconductor chip 120 may be provided to expose an edge portion of the first semiconductor chip 110, and the exposed portion of the first semiconductor chip 110 may be covered with the mold layer 150. In this case, a corner of the first semiconductor chip 110 covered with the mold layer 150 may be cracked or may fail, because the corner of the first semiconductor chip 110 is especially vulnerable to external stress. Such cracking or failure may be dependent on the stiffness of the corresponding portion.

Further, the first semiconductor chip 110 may include a first semiconductor substrate, and the second semiconductor chip 120 may include a second semiconductor substrate. In the case where the first semiconductor substrate and the second semiconductor substrate contain a silicon layer, due to a large difference in thermal expansion coefficient between the silicon layer and the second under-fill layer 114, a rapid change in temperature may result in stress being generated and applied to an edge of the second semiconductor chip 120, and, in severe cases, the second semiconductor chip 120 may be broken.

To address these cracking and failure issues, the first stress-relieving structure 115 may be provided on the first semiconductor chip 110 exposed by the second semiconductor chip 120.

Figure 2B:
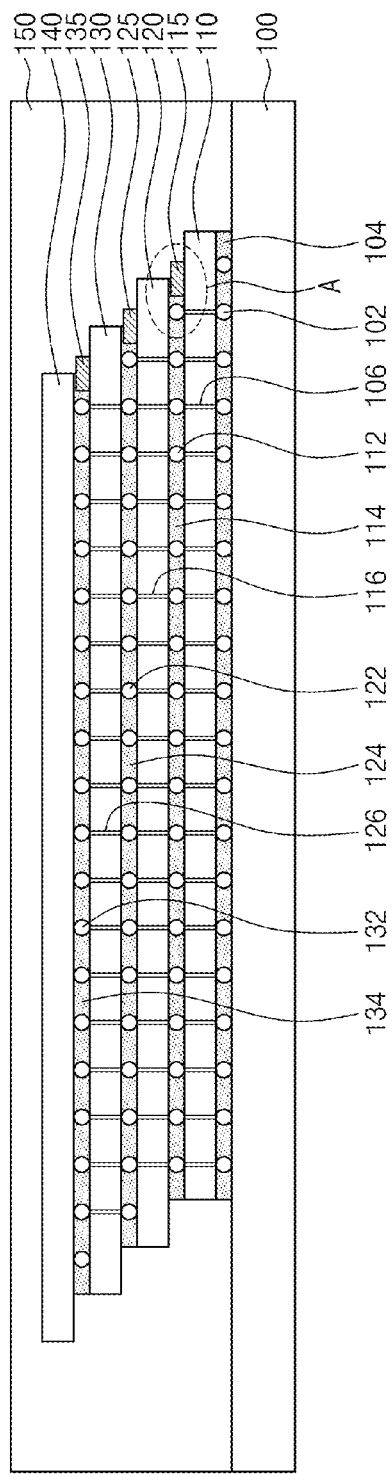
Figure 2C:
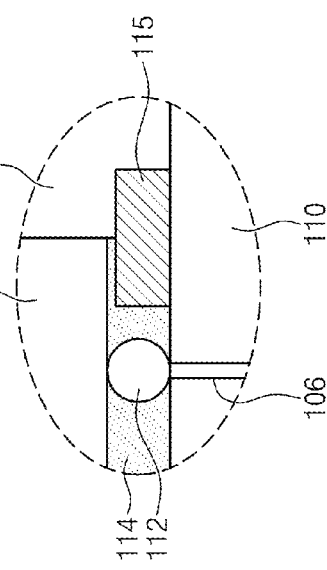

In some exemplary embodiments, as shown in FIGS. 2B and 2C, the first stress-relieving structure 115 may be provided on the first semiconductor chip 110 to be in contact with the second under-fill layer 114. Further, a portion of the first stress-relieving structure 115 may be covered with the second under-fill layer 114, and another portion of the first stress-relieving structure 115 may be covered with the mold layer 150. For example, when viewed in plan view, the first stress-relieving structure 115 may be partially overlapped with the second semiconductor chip 120 and include a portion outward protruding from the edge of the second semiconductor chip 120. Similarly, the second stress-relieving structure 125 and the third stress-relieving structure 135 may be provided on the second semiconductor chip 120 and the third semiconductor chip 130, respectively. The second stress-relieving structure 125 and the third stress-relieving structure 135 may be provided in substantially the same manner as the first stress-relieving structure 115, and thus, for the sake of brevity, a description thereof will be omitted.

Figure 2D:
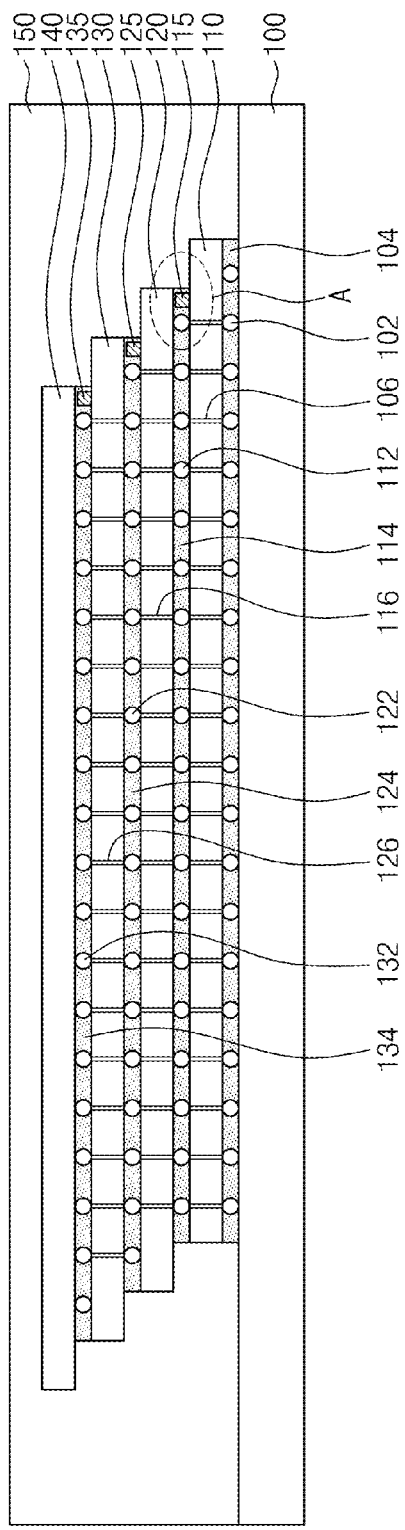
Figure 2E:
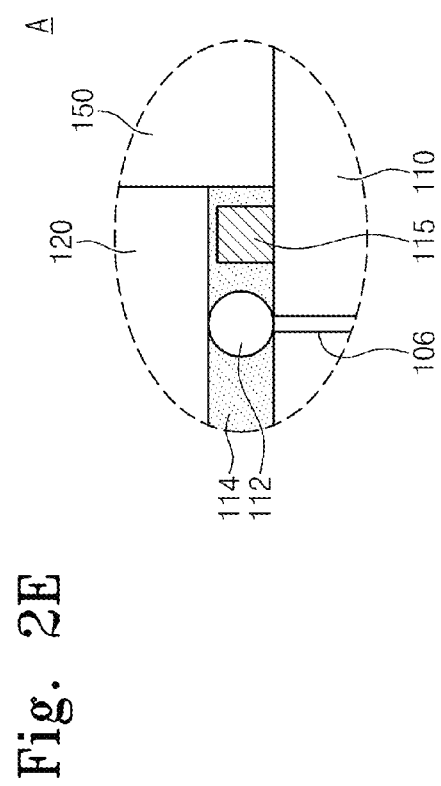

In other exemplary embodiments, as shown in FIGS. 2D and 2E, the first stress-relieving structure 115 may be provided on the first semiconductor chip 110 to be buried in the second under-fill layer 114. For example, the first stress-relieving structure 115 may be wholly overlapped with the edge portion of the second semiconductor chip 120, when viewed in plan view. Further, the first stress-relieving structure 115 may be an isolated structure that is wholly covered with the second under-fill layer 114. Similarly, the second stress-relieving structure 125 and the third stress-relieving structure 135 may be provided on the second semiconductor chip 120 and the third semiconductor chip 130, respectively. The second stress-relieving structure 125 and the third stress-relieving structure 135 may be provided in substantially the same manner as the first stress-relieving structure 115, and thus, for the sake of brevity, a description thereof will be omitted.

Figure 2F:
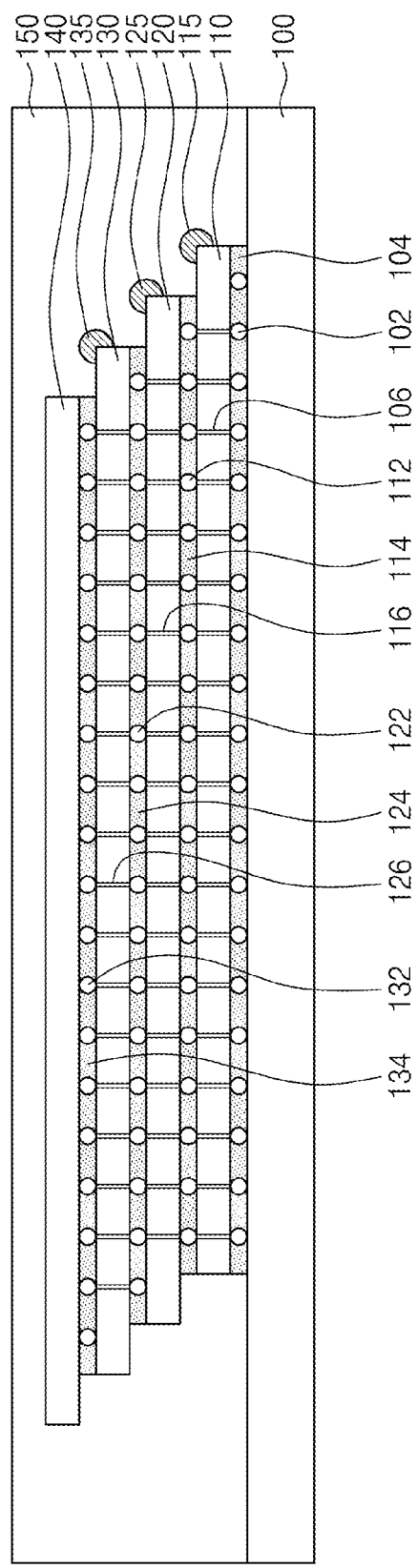

In yet other exemplary embodiments, as shown in FIG. 2F, the first stress-relieving structure 115 may be provided on the corner portion of the first semiconductor chip 110 and have an outward protruding structure. The first stress-relieving structure 115 may be provided to have substantially circular shape. However, this shape is only an example, and other shapes are also contemplated. Similarly, the second stress-relieving structure 125 and the third stress-relieving structure 135 may be provided on the second semiconductor chip 120 and the third semiconductor chip 130, respectively. The second stress-relieving structure 125 and the third stress-relieving structure 135 may be provided in substantially the same manner as the first stress-relieving structure 115, and thus, for the sake of brevity, a description thereof will be omitted.

According to certain exemplary embodiments, the first stress-relieving structure 115, the second stress-relieving structure 125, and the third stress-relieving structure 135 may have rectangular sections as shown in FIGS. 2A-2F, but the structure and shape thereof may be variously changed, as will be described below.

The first stress-relieving structure 115, the second stress-relieving structure 125, and the third stress-relieving structure 135 may include a material of low modulus. For example, the first stress-relieving structure 115, the second stress-relieving structure 125, and the third stress-relieving structure 135 may include at least one of epoxy resin, polyimide, silicone, or rubber.

The structure and disposition of the first stress-relieving structure 115, the second stress-relieving structure 125, and the third stress-relieving structure 135 will be described in detail below.

FIGS. 3A through 3E are plan views illustrating some examples of a stress-relieving structures according to exemplary embodiments. For the sake of description, the first stress-relieving structure 115 will be exemplarily described in the following description of FIGS. 3A through 3E. It will be understood that the second stress-relieving structure 125 and the third stress-relieving structure 135 may be configured to have substantially the same shape, structure, and disposition as those of the first stress-relieving structure 115.

Figure 3A:
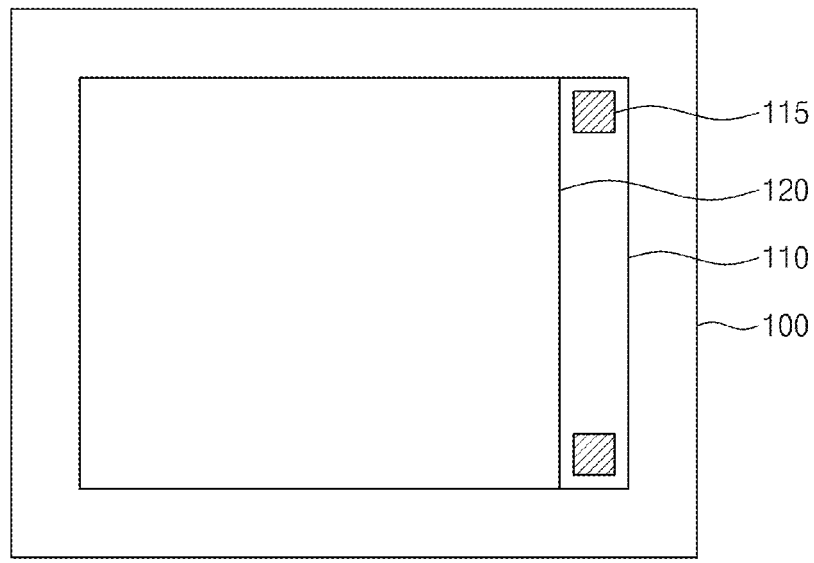
FIGS. 3A through 3E are plan views illustrating some examples of a stress-relieving structure according to exemplary embodiments.

Referring to FIG. 3A, the first stress-relieving structure 115 may be provided on the first semiconductor chip 110 and have a tetragonal or rectangular shape. In certain exemplary embodiments, the first stress-relieving structure 115 may be provided on a corner portion of the first semiconductor chip 110. For example, the first stress-relieving structure 115 may be provided on one or both corners of the first semiconductor chip 110 exposed by the second semiconductor chip 120. In some modified exemplary embodiments, the first stress-relieving structure 115 may have a polygonal shape, when viewed in plan view.

Figure 3B:
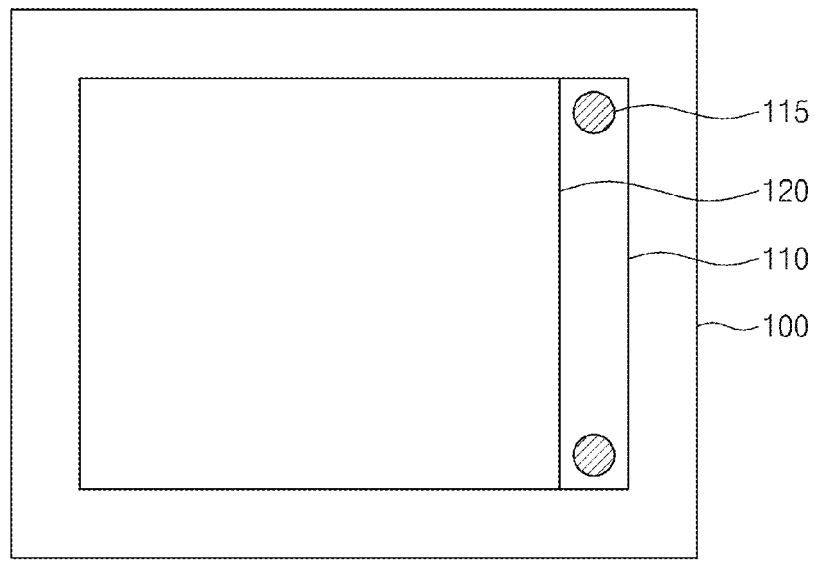

Referring to FIG. 3B, the first stress-relieving structure 115 may be provided on the first semiconductor chip 110 and have a curved or circular shape. The first stress-relieving structure 115 may be provided on a corner portion of the first semiconductor chip 110. For example, the first stress-relieving structure 115 may be provided on one or both corners of the first semiconductor chip 110 exposed by the second semiconductor chip 120. In some modified exemplary embodiments, the first stress-relieving structure 115 may have an elliptical shape, when viewed in plan view.

Figure 3C:
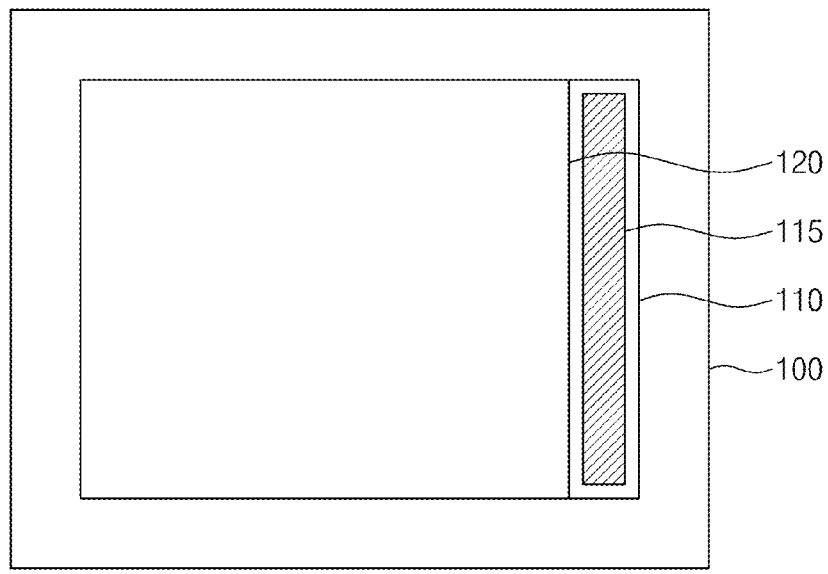

Referring to FIG. 3C, the first stress-relieving structure 115 may be provided on the first semiconductor chip 110 and have a line or bar shape. For example, the first stress-relieving structure 115 may be provided on a portion of the first semiconductor chip 110, which is exposed by the second semiconductor chip 120, and be elongated along the edge of the first semiconductor chip 110.

Figure 3D:
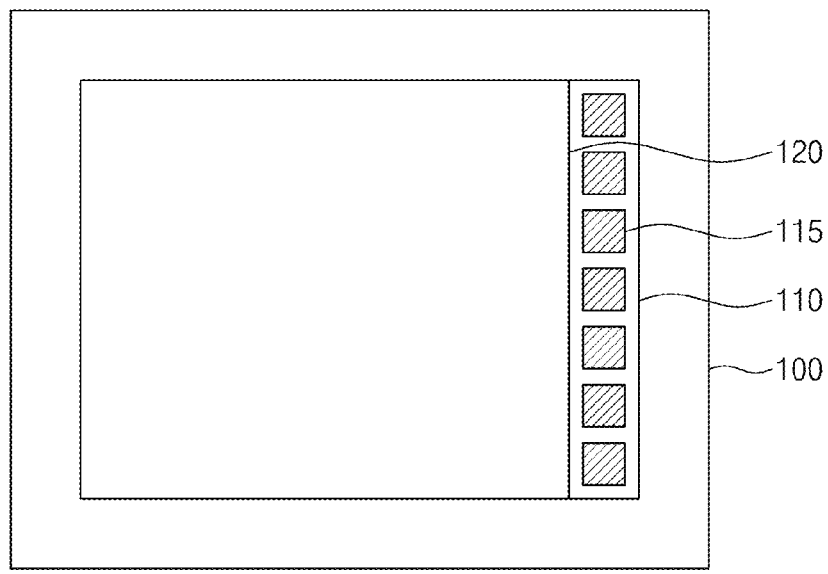

Referring to FIG. 3D, the first stress-relieving structure 115 may be provided on a portion of the first semiconductor chip 110 exposed by the second semiconductor chip 120 and include a plurality of first stress-relieving structures 115 arranged along the edge of the first semiconductor chip 110. At least one of the first stress-relieving structures 115 may have a dot, circular, or rectangular shape. Alternatively each of the first stress-relieving structures 115 may have a dot, circular, or rectangular shape.

Figure 3E:
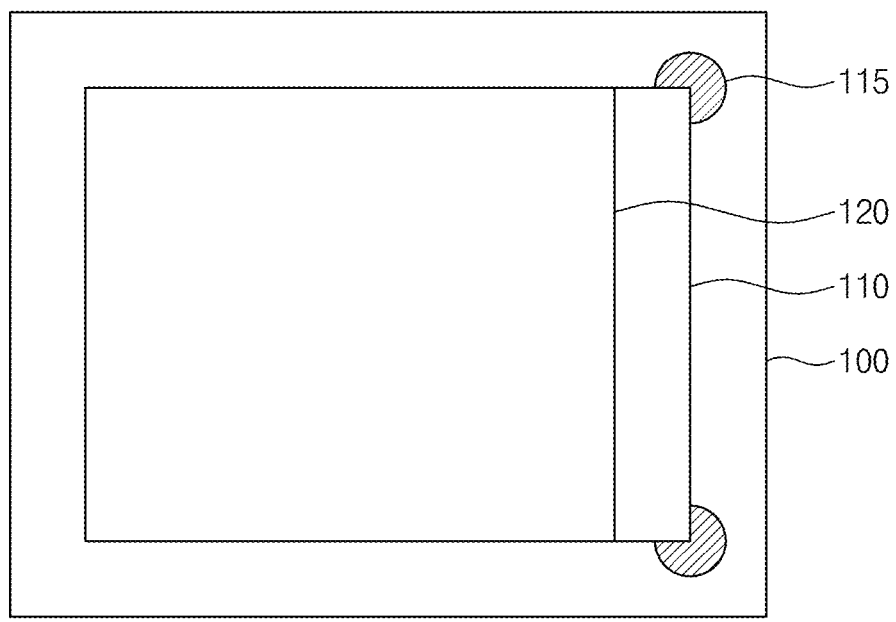

Referring to FIG. 3E, the first stress-relieving structure 115 may be provided at the corners of the first semiconductor chip 110. Unlike those of FIGS. 3A through 3D, the first stress-relieving structure 115 in the present exemplary embodiment may be provided on at least one of side surfaces of the corners of the first semiconductor chip 110, and thus, the first stress-relieving structure 115 may have a structure outward protruding from the first semiconductor chip 110. The first stress-relieving structure 115 may be provided to have a substantially circular shape. In some modified exemplary embodiments, the first stress-relieving structure 115 may have a polygonal and/or elliptical shape.

The first stress-relieving structure 115 of the semiconductor package may include at least one of combinations of several structures described with reference to FIGS. 3A through 3E. For example, the shapes of the first stress-relieving structures 115 may be mixed, or as another example, one first stress-relieving structure 115 may be provided at a corner as shown in FIG. 3E, and another may be provided as shown in FIG. 3A. Many such different combinations are contemplated. Further, exemplary embodiments are not limited to the specific structures of the first stress-relieving structure 115 described with reference to FIGS. 3A through 3E.

Figure 4A:
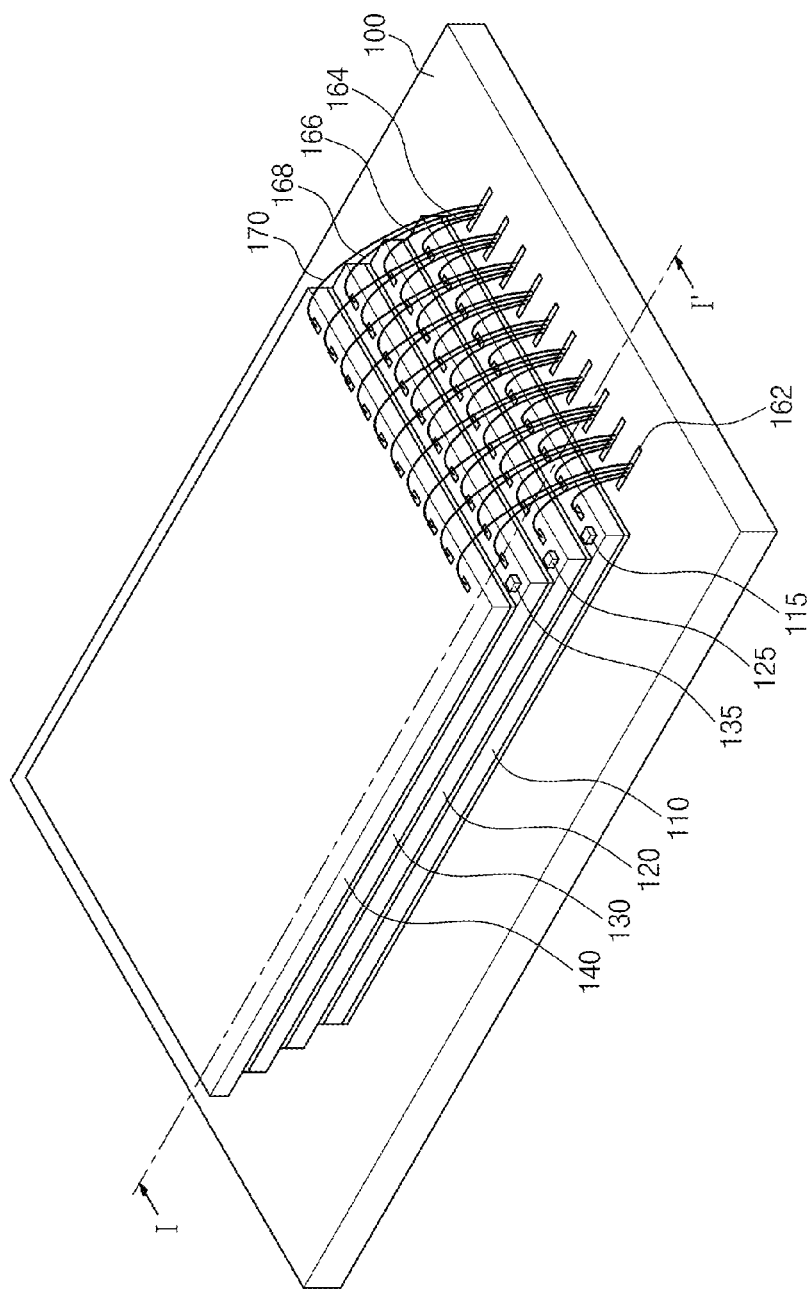
FIG. 4A is a perspective view illustrating a semiconductor package according to other exemplary embodiments.
Figure 4B:
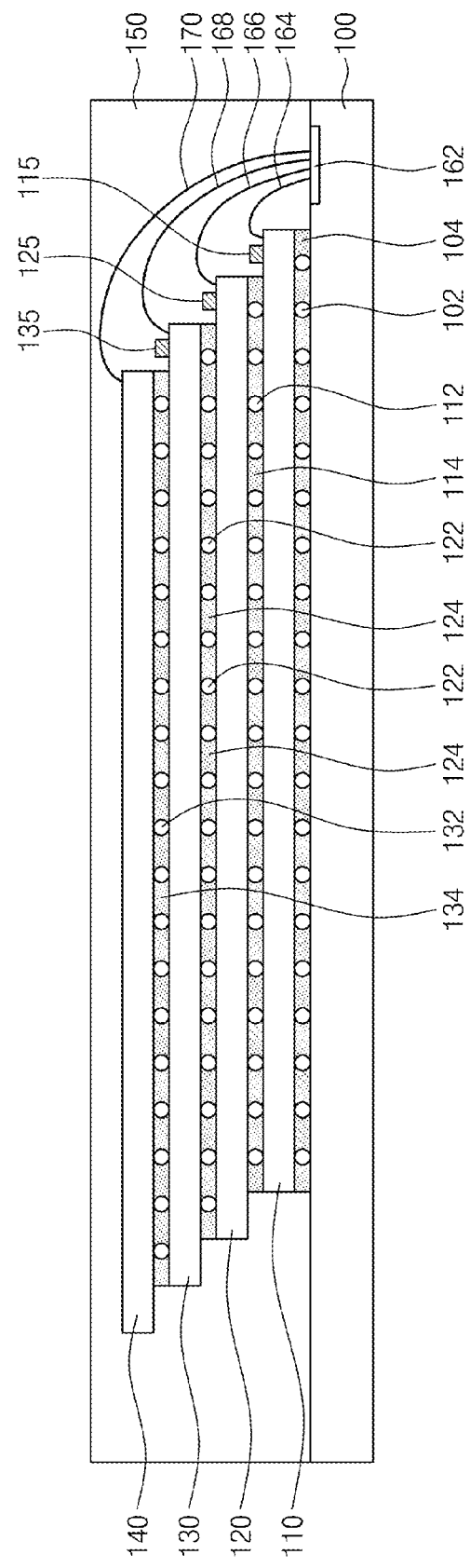
FIG. 4B is a sectional view of the semiconductor package taken along a line I-I' of FIG. 4A.

FIG. 4A is a perspective view illustrating a semiconductor package according to other exemplary embodiments, and FIG. 4B is a sectional view of the semiconductor package taken along a line I-I' of FIG. 4A.

Referring to FIGS. 4A and 4B, a semiconductor package may include a package substrate 100, a plurality of semiconductor chips 110, 120, 130, and 140, which are vertically stacked on the package substrate 100, and a mold layer 150 covering the package substrate 100 and the semiconductor chips 110, 120, 130, and 140.

As shown in FIGS. 4A and 4B, in the semiconductor package, the package substrate 100 may be electrically connected to the first to fourth semiconductor chips 110, 120, 130, and 140 via bonding wires 164, 166, 168, and 170, respectively. The package substrate 100 may further include pads 162, to which the bonding wires 164, 166, 168, and 170 are electrically connected.

The semiconductor package in the present exemplary embodiments may be substantially the same as those described with reference to FIGS. 1 and 2A through 2F, except for the use of the bonding wires 164, 166, 168, and 170 to connect the package substrate 100 to the first to fourth semiconductor chips 110, 120, 130, and 140, respectively. In this sense, a detailed description of elements constituting the semiconductor package of FIGS. 4A and 4B will be omitted.

Hereinafter, additional exemplary embodiment of semiconductor packages will be described, in which the package substrate 100 is electrically connected to the first to fourth semiconductor chips 110, 120, 130, and 140 using first to fourth vias 106, 116, 126. However, it will be understood that, in the alternative in each of the additional exemplary embodiments described hereinafter that the package substrate 100 and the first to fourth semiconductor chips 110, 120, 130, and 140 may be electrically connected to each other by the bonding wires 164, 166, 168, and 170. Further, electrical connection between the package substrate 100 and the first to fourth semiconductor chips 110, 120, 130, and 140 is not limited to the above-described methods, and other connection methods are also contemplated.

Figure 5:
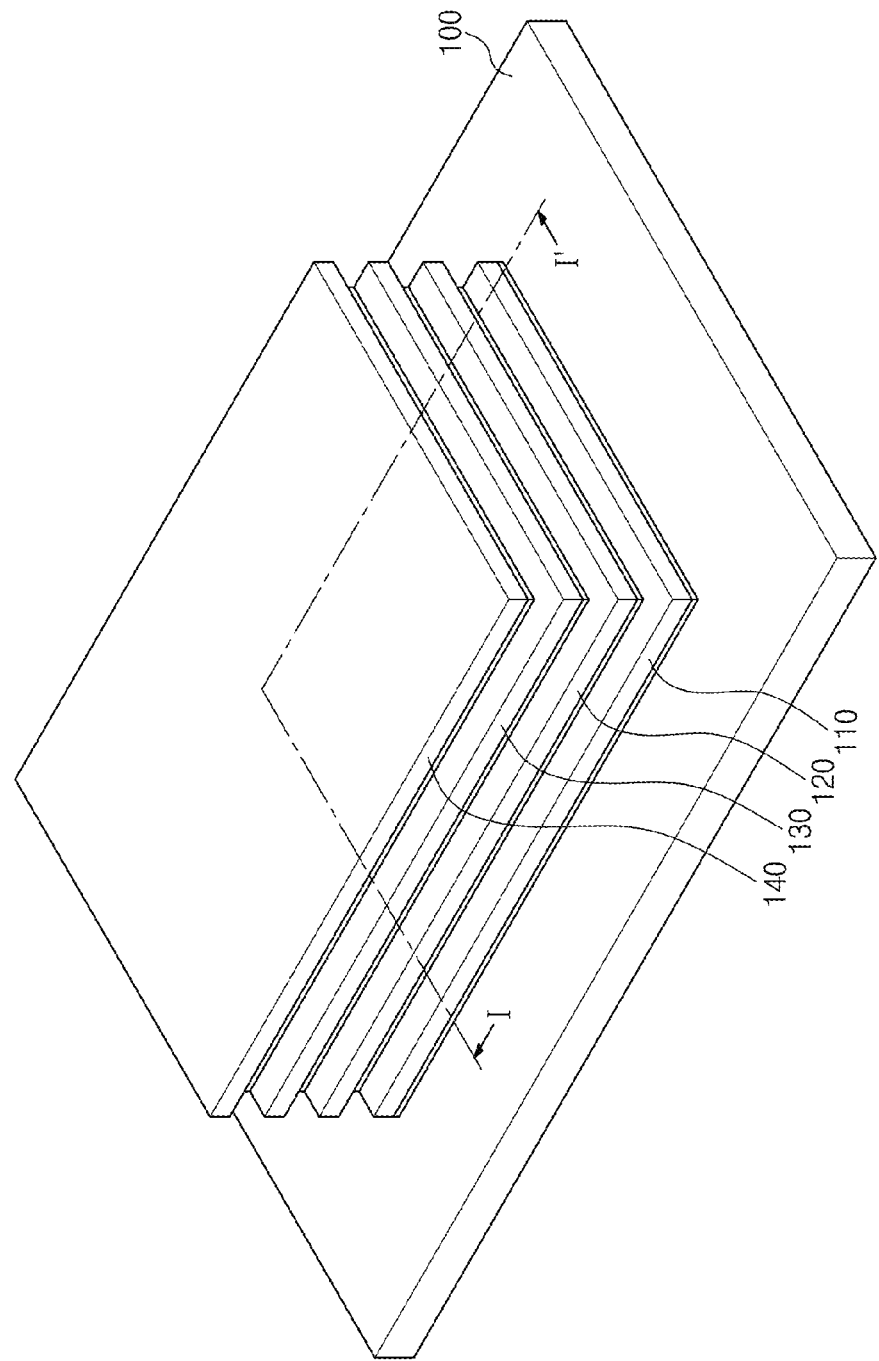
FIG. 5 is a perspective view illustrating a semiconductor package according to still other exemplary embodiments.

FIG. 5 is a perspective view illustrating a semiconductor package according to still other exemplary embodiments. FIGS. 6A through 6F are sectional views of the semiconductor packages taken along a line I-I' of FIG. 5.

Referring to FIGS. 5 and 6A through 6F, a semiconductor package may include a package substrate 100 and a plurality of semiconductor chips 110, 120, 130, and 140 vertically stacked on the package substrate 100.

Referring to FIG. 5, the semiconductor chips 110, 120, 130, and 140 may have substantially the same size or area. The semiconductor chips 110, 120, 130, and 140 may be stacked to form a staircase or cascade structure. In certain exemplary embodiments, if the semiconductor chips have a rectangular shape, each of the semiconductor chips may be horizontally shifted along a diagonal direction thereof with respect to an underlying semiconductor chip and be vertically stacked on the underlying semiconductor chip. For example, as shown in FIG. 5, the first semiconductor chip 110 may be stacked on the package substrate 100, and the second semiconductor chip 120 may be leftward and upward moved with respect to the first semiconductor chip 110 and stacked on the first semiconductor chip 110 to expose right and lower portions of the first semiconductor chip 110. Similarly, the third semiconductor chip 130 may be leftward and upward moved with respect to the second semiconductor chip 120 and stacked on the second semiconductor chip 120 to expose right and lower portions of the second semiconductor chip 120, and the fourth semiconductor chip 140 may be leftward and upward moved with respect to the third semiconductor chip 130 and stacked on the third semiconductor chip 130 to expose right and lower portions of the third semiconductor chip 130.

Referring to FIGS. 6A through 6F, the semiconductor package may further include first connection patterns 102, a first under-fill layer 104, second connection patterns 112, a second under-fill layer 114, third connection patterns 122, a third under-fill layer 124, fourth connection patterns 132, and a fourth under-fill layer 134.

The first semiconductor chip 110 may include first vias 106, the second semiconductor chip 120 may include second vias 116, the third semiconductor chip 130 may include third vias 126. The package substrate 100 may be electrically connected to the first to fourth semiconductor chips 110, 120, 130, and 140 through the first to fourth vias 136. As discussed above, alternatively, the package substrate 100 may be electrically connected to the first to fourth semiconductor chips 110, 120, 130, and 140 using bonding wires.

Figure 6A:
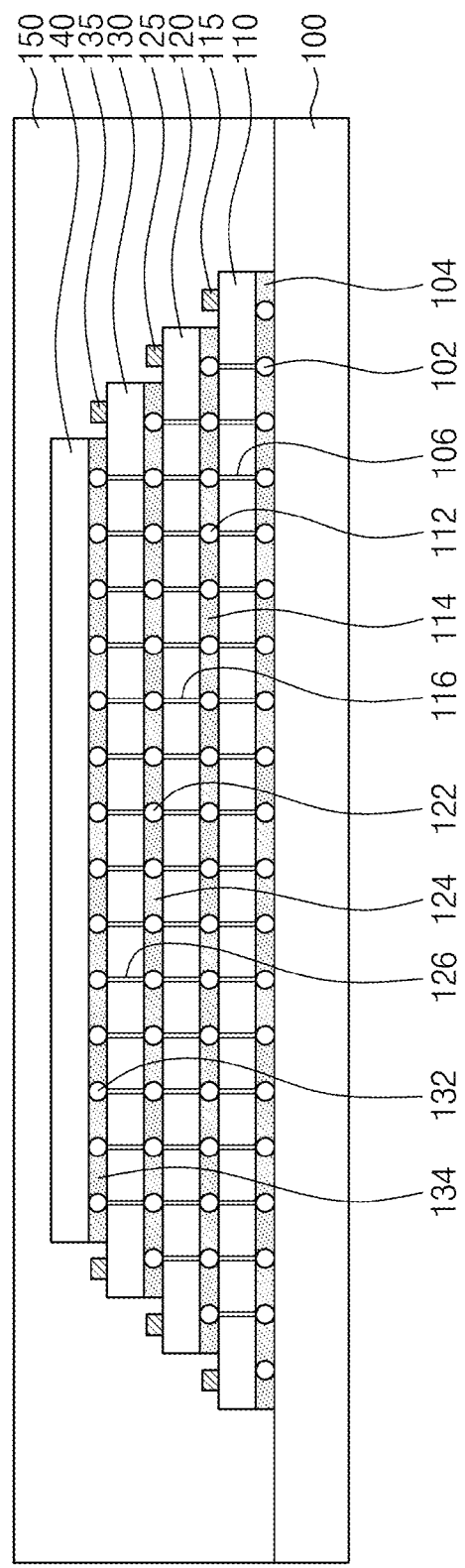
FIGS. 6A through 6F are sectional views of the semiconductor packages taken along a line I-I' of FIG. 5.

In certain exemplary embodiments, as shown in FIG. 6A, a first stress-relieving structure 115 may be provided adjacent to the second under-fill layer 114, on the first semiconductor chip 110. As shown in FIG. 6A, the first stress-relieving structure 115 is not in contact with the second under-fill layer 114 and, when viewed in plan view, is not overlapped with the second semiconductor chip 120. However, this is only an example, and alternative configurations will be discussed further below. The semiconductor package may further include a second stress-relieving structure 125 and a third stress-relieving structure 135. Each of the second stress-relieving structure 125 and the third stress-relieving structure 135 may be provided to have substantially the same structural feature as the first stress-relieving structure 115, and thus, for the sake of brevity, a description thereof will be omitted.

Figure 6B:
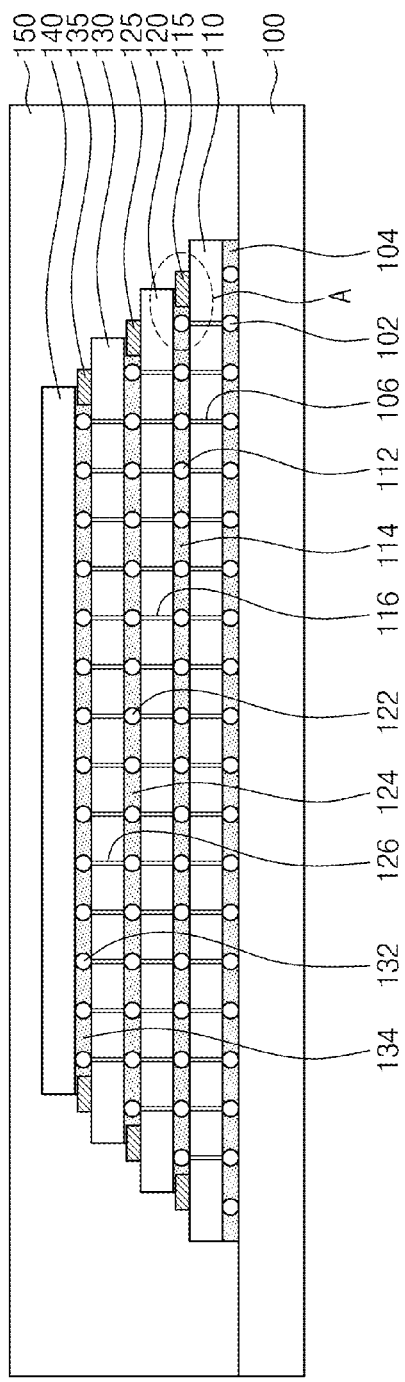
Figure 6C:
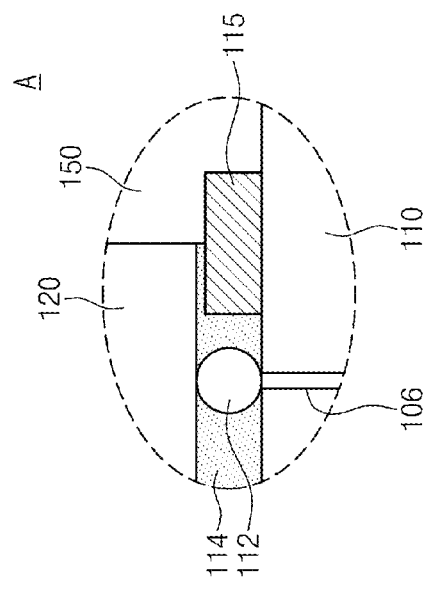

In certain exemplary embodiments, as shown in FIGS. 6B and 6C, first stress-relieving structure 115 may be provided on the first semiconductor chip 110 to be in contact with the second under-fill layer 114. Further, when viewed in plan view, the first stress-relieving structure 115 may be partially overlapped with the second semiconductor chip 120 and include a portion outward protruding from the edge of the second semiconductor chip 120. The semiconductor package may further include a second stress-relieving structure 125 and a third stress-relieving structure 135. Each of the second stress-relieving structure 125 and the third stress-relieving structure 135 may be provided to have substantially the same structural feature as the first stress-relieving structure 115, and thus, for the sake of brevity, a description thereof will be omitted.

Figure 6D:
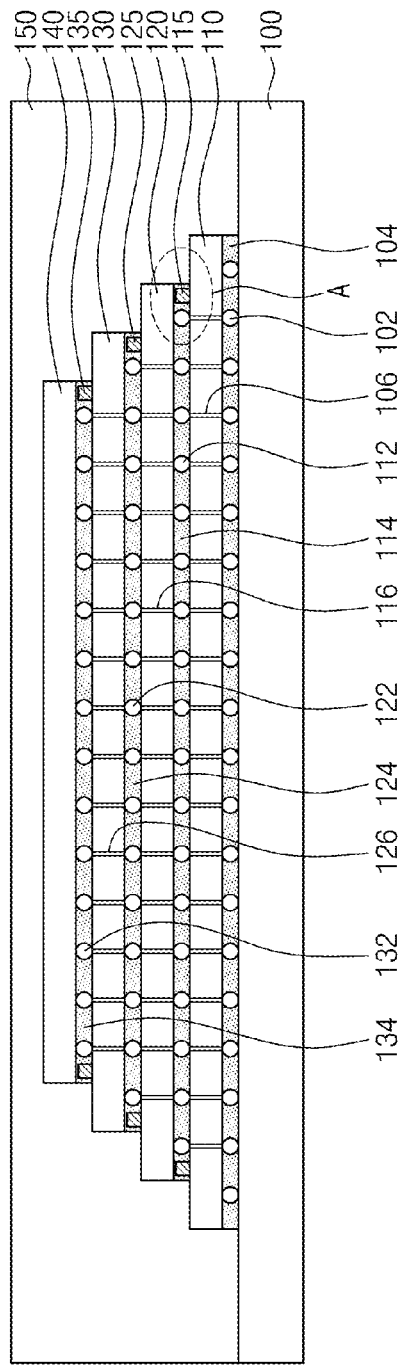
Figure 6E:
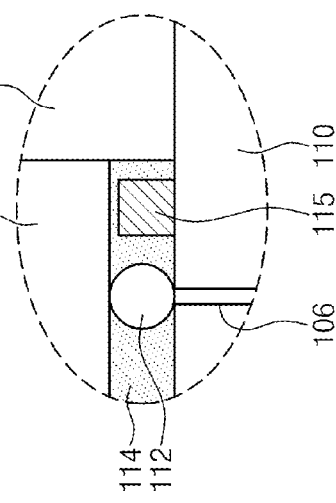

In certain exemplary embodiments, as shown in FIGS. 6D and 6E, the first stress-relieving structure 115 may be provided on the first semiconductor chip 110 to be buried in the second under-fill layer 114. For example, the first stress-relieving structure 115 may be wholly overlapped with the edge portion of the second semiconductor chip 120, when viewed in plan view. The semiconductor package may further include a second stress-relieving structure 125 and a third stress-relieving structure 135. Each of the second stress-relieving structure 125 and the third stress-relieving structure 135 may be provided to have substantially the same structural feature as the first stress-relieving structure 115, and thus, for the sake of brevity, a description thereof will be omitted.

Figure 6F:
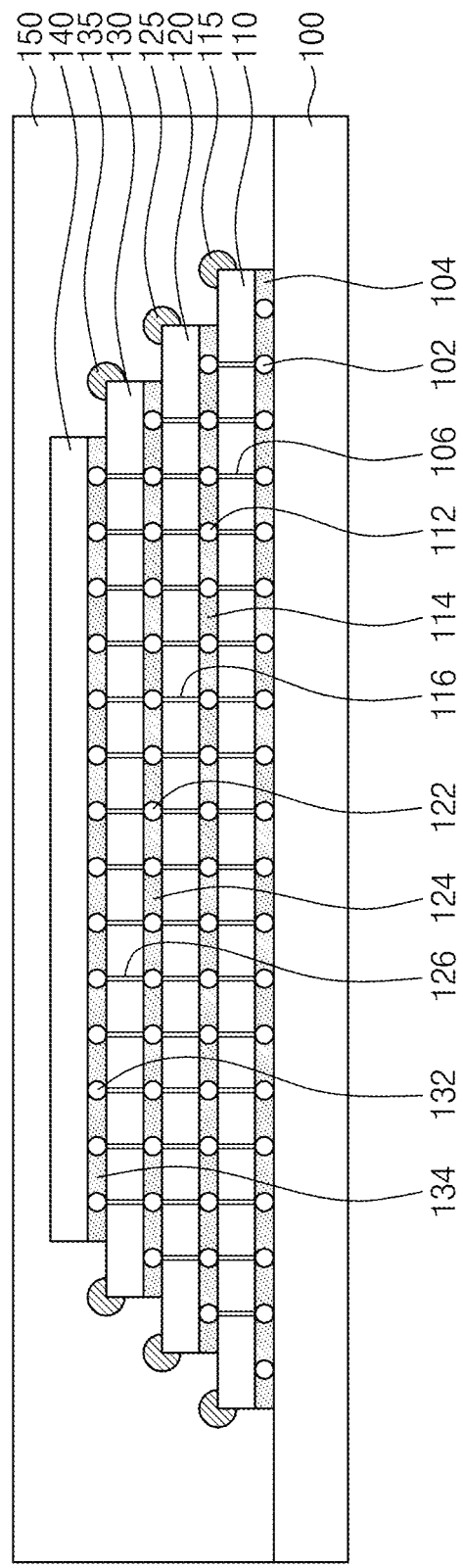

In certain exemplary embodiments, as shown in FIG. 6F, the first stress-relieving structure 115 may be provided on the corner portion of the first semiconductor chip 110 and have an outward protruding structure. The first stress-relieving structure 115 may be provided to have a substantially circular shape. The semiconductor package may further include a second stress-relieving structure 125 and third stress-relieving structure 135. Each of the second stress-relieving structure 125 and the third stress-relieving structure 135 may be provided to have substantially the same structural feature as the first stress-relieving structure 115, and thus, for the sake of brevity, a description thereof will be omitted.

The semiconductor package of FIGS. 5 and 6A through 6F may be configured to be substantially the same as those described with reference to FIGS. 1 and 2A through 2F, except for the stacking structure of the semiconductor chips 110, 120, 130, and 140, and thus, a detailed description thereof will be omitted.

The structure and disposition of the first stress-relieving structure 115, the second stress-relieving structure 125, and the third stress-relieving structure 135 will be described in detail below.

FIGS. 7A through 7E are plan views illustrating some examples of a stress-relieving structure according to other exemplary embodiments. For the sake of description, the first stress-relieving structure 115 will be exemplarily described in the following description of FIGS. 7A through 7E. The second stress-relieving structure 125 and the third stress-relieving structure 135 may be configured to have substantially the same shape, structure, and disposition as those of the first stress-relieving structure 115, and thus, a detailed description thereof will be omitted.

Figure 7A:
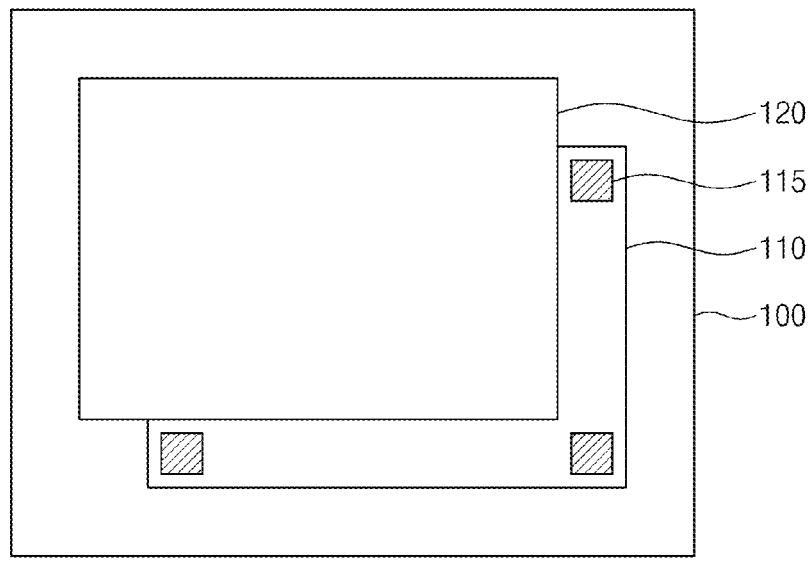
FIGS. 7A through 7E are plan views illustrating some examples of a stress-relieving structure according to other exemplary embodiments.

Referring to FIG. 7A, the first stress-relieving structure 115 may be provided on the first semiconductor chip 110 and have a tetragonal or rectangular shape. The first semiconductor chip 110 may have three corners exposed by the second semiconductor chip 120, and the first stress-relieving structure 115 may be provided on at least one of the exposed three corners. In some modified exemplary embodiments, the first stress-relieving structure 115 may have a polygonal shape, when viewed in plan view.

Figure 7B:
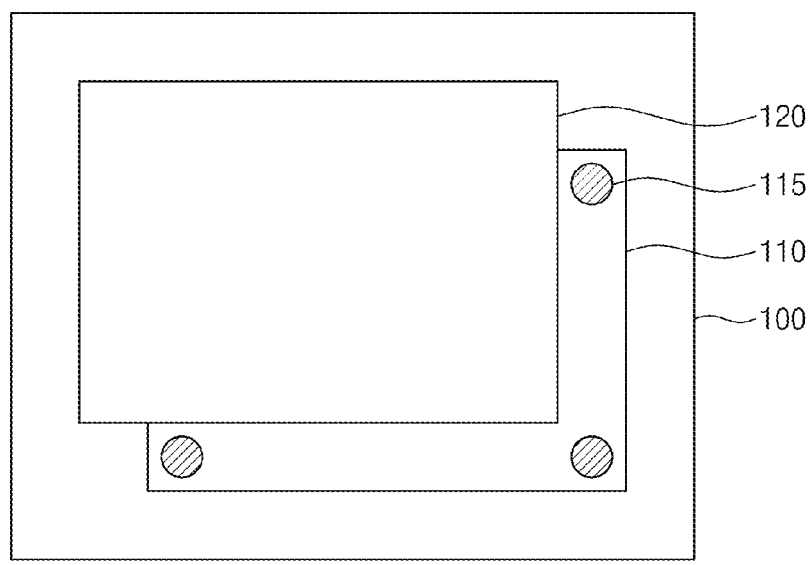

Referring to FIG. 7B, the first stress-relieving structure 115 may be provided on the first semiconductor chip 110 and have a curved or circular shape. The first semiconductor chip 110 may have three corners exposed by the second semiconductor chip 120, and the first stress-relieving structure 115 may be provided on at least one of the exposed three corners. In some modified exemplary embodiments, the first stress-relieving structure 115 may have an elliptical shape, when viewed in plan view.

Figure 7C:
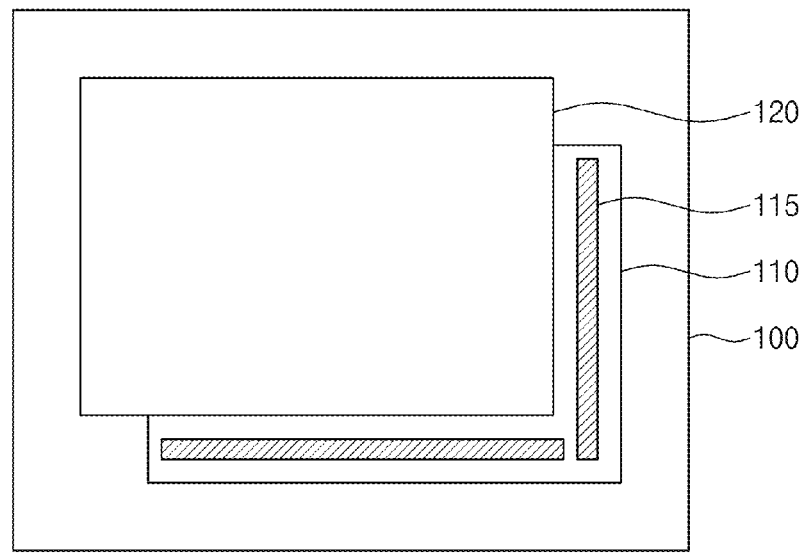

Referring to FIG. 7C, the first stress-relieving structure 115 may be provided on the first semiconductor chip 110 and be a line-shaped structure extending along the edge of the first semiconductor chip 110. The first semiconductor chip 110 may have an 'L'-shaped edge exposed by the second semiconductor chip 120. The first stress-relieving structure 115 may include at least one line-shaped pattern extending from a junction of two sides in the 'L'-shaped edge toward one of the exposed corners of the first semiconductor chip 110.

Figure 7D:
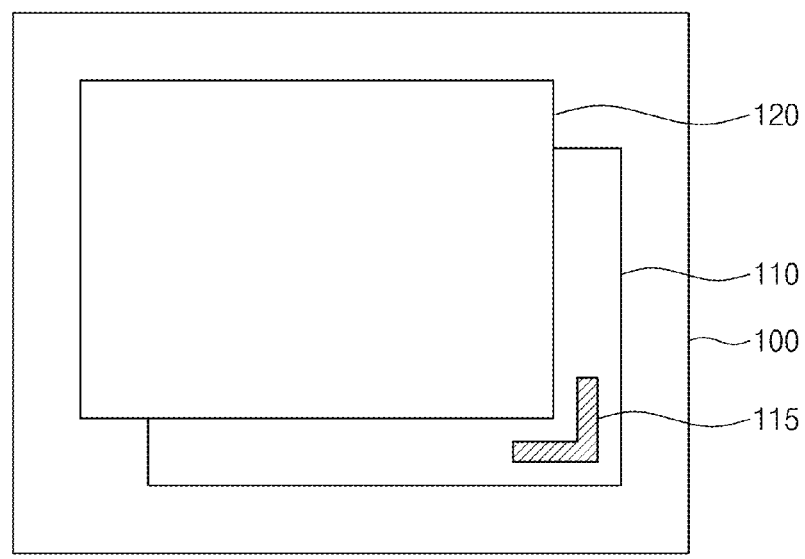

Referring to FIG. 7D, the first stress-relieving structure 115 may be provided on the first semiconductor chip 110 to have an 'L'-shaped structure. The first semiconductor chip 110 may have an 'L'-shaped edge exposed by the second semiconductor chip 120. The first stress-relieving structure 115 may be locally provided at a junction of two sides in the 'L'-shaped edge of the first semiconductor chip 110. In certain exemplary embodiments, the 'L'-shaped first stress-relieving structure 115 may be elongated toward one of the exposed corners of the first semiconductor chip 110. Alternatively, the 'L'-shaped first stress-relieving structure 115 may be elongated toward both of the exposed corners of the first semiconductor chip 110.

Figure 7E:
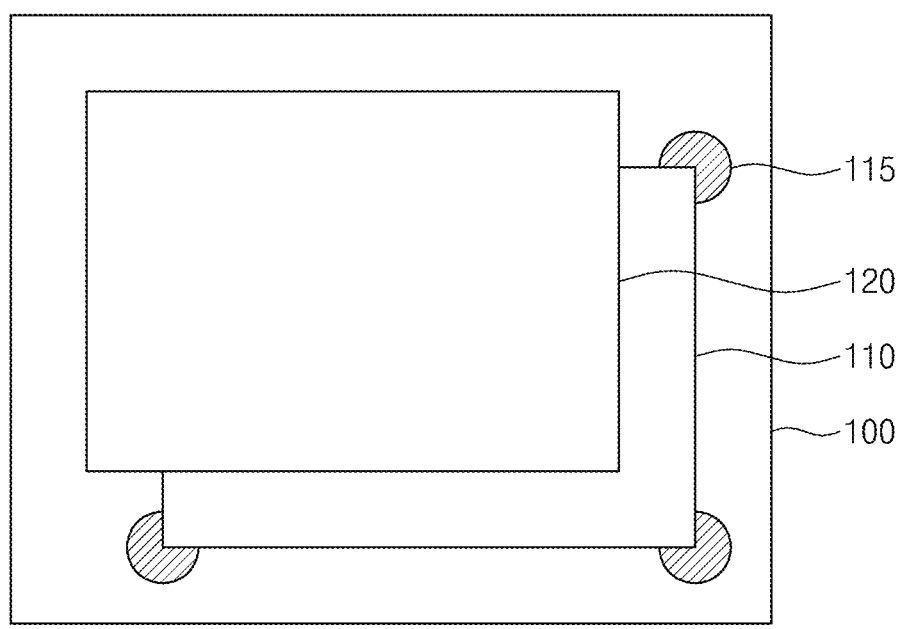

Referring to FIG. 7E, the first stress-relieving structure 115 may be provided near the corners of the first semiconductor chip 110. Unlike those of FIGS. 7A through 7D, the first stress-relieving structure 115 in the present exemplary embodiment may be provided on at least one of side surfaces of the exposed corners of the first semiconductor chip 110, and thus, the first stress-relieving structure 115 may have a structure outward protruding from the first semiconductor chip 110. The first stress-relieving structure 115 may be provided to have substantially circular shape. In some modified exemplary embodiments, the first stress-relieving structure 115 may have a polygonal and/or elliptical shape.

The first stress-relieving structure 115 of the semiconductor package may include at least one of combinations of several structures described with reference to FIGS. 7A through 7E. Further, exemplary embodiments are not limited to the specific structures of the first stress-relieving structure 115 described with reference to FIGS. 7A through 7E. Other structures and combinations of the structures of FIGS. 7A through 7E are contemplated.

Figure 8:
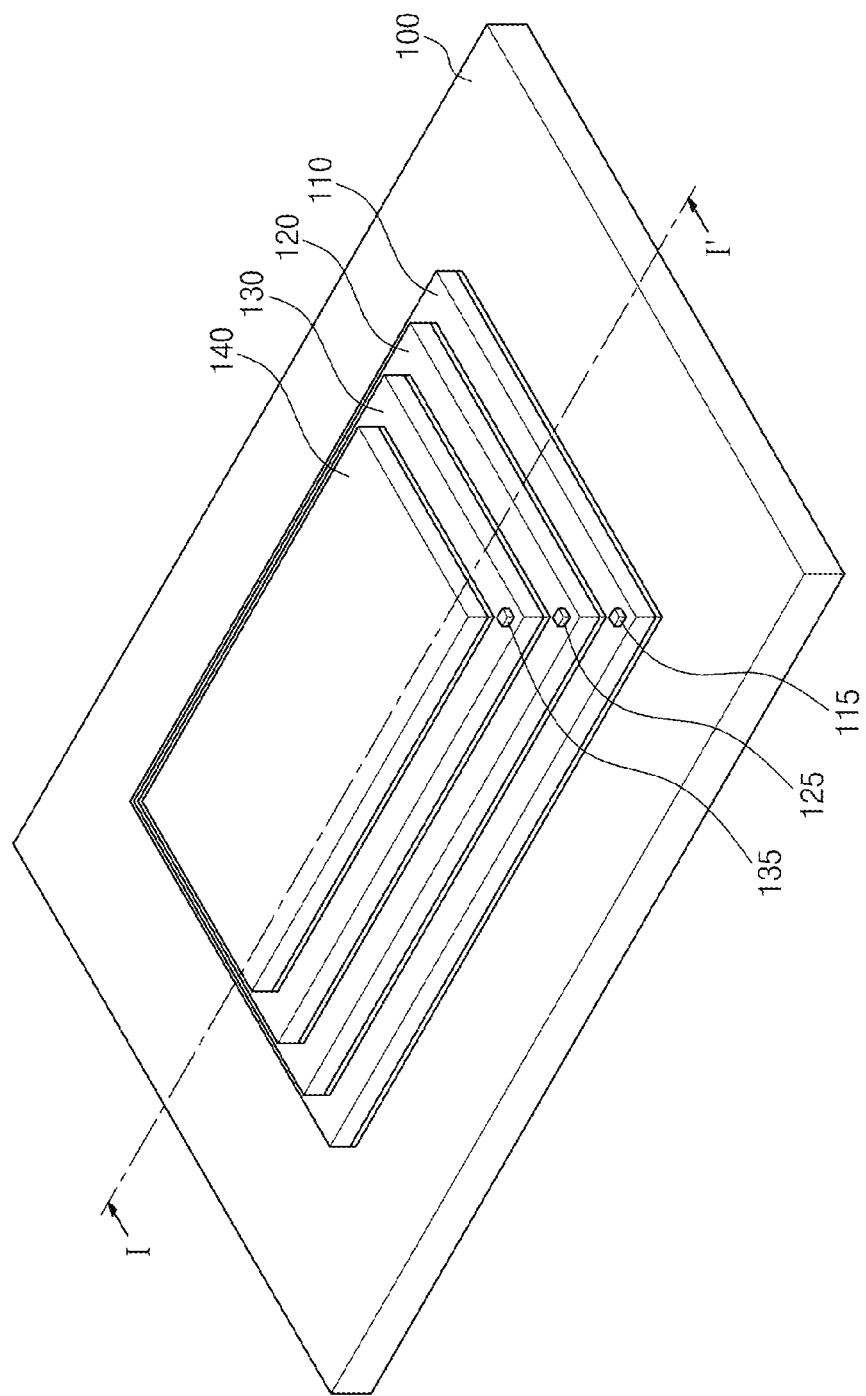
FIG. 8 is a perspective view illustrating a semiconductor package according to even other exemplary embodiments.

FIG. 8 is a perspective view illustrating a semiconductor package according to even other exemplary embodiments. The semiconductor package according to the present exemplary embodiment may have a section similar to one of FIGS. 6A through 6F, when it is cut along a line I-I' of FIG. 8, and thus, for the sake of brevity, a description thereof will be omitted.

Referring to FIG. 8, a semiconductor package may include a package substrate 100 and a plurality of semiconductor chips vertically stacked on the package substrate 100.

As shown in FIG. 8, the semiconductor chips may each have a different size or area. For example, when viewed in plan view, the first semiconductor chip 110 may be larger than the second semiconductor chip 120, the second semiconductor chip 120 may be larger than the third semiconductor chip 130, the third semiconductor chip 130 may be larger than the fourth semiconductor chip 140. The first to fourth semiconductor chips 110, 120, 130, and 140 may be vertically stacked one on another in a concentric manner. Accordingly, the edge of the first semiconductor chip 110 may be exposed by the second to fourth semiconductor chips 120, 130, and 140, the edge of the second semiconductor chip 120 may be exposed by the third and fourth semiconductor chips 130 and 140, and the edge of the third semiconductor chip 130 may be exposed by the fourth semiconductor chip 140.

As further shown in FIG. 8, the semiconductor package may further include a first stress-relieving structure 115 disposed on the first semiconductor chip 110, a second stress-relieving structure 125 disposed on the second semiconductor chip 120, and a third stress-relieving structure 135 disposed on the third semiconductor chip 130.

The first to third stress-relieving structures 115, 125, and 135 may be configured to have substantially the same structural features as those described with reference to FIGS. 6A through 6F, and thus, for the sake of brevity, a description thereof will be omitted.

The semiconductor package of FIGS. 8 and 6A through 6F may be configured to be substantially the same as those described with reference to FIGS. 1 and 2A through 2F, except for the chip size and stacking structure of the semiconductor chips 110, 120, 130, and 140, and thus, a detailed description thereof will be omitted.

The structure and disposition of the first stress-relieving structure 115, the second stress-relieving structure 125, and the third stress-relieving structure 135 will be described in detail below.

FIGS. 9A through 9E are plan views illustrating some examples of a stress-relieving structure according to still other exemplary embodiments. For the sake of description, the first stress-relieving structure 115 will be exemplarily described in the following description of FIGS. 9A through 9E. The second stress-relieving structure 125 and the third stress-relieving structure 135 may be configured to have substantially the same shape, structure, and disposition as those of the first stress-relieving structure 115.

Figure 9A:
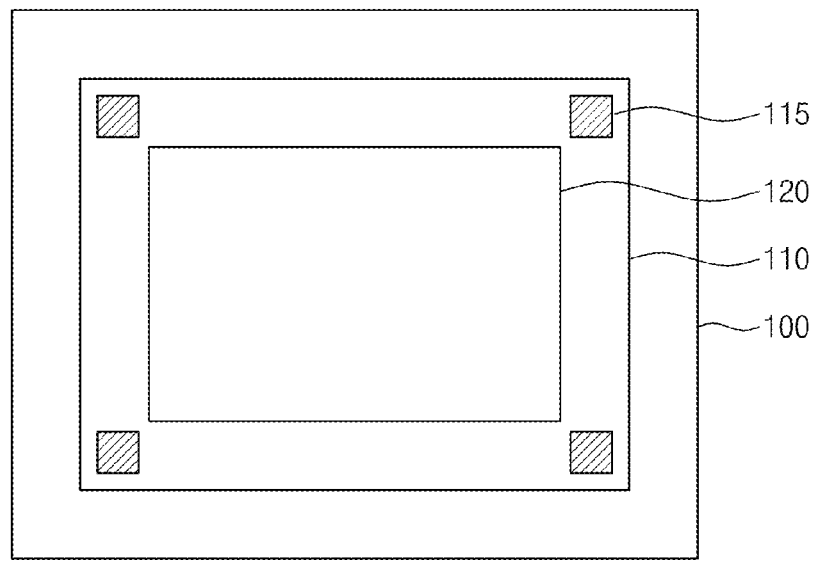
FIGS. 9A through 9E are plan views illustrating some examples of a stress-relieving structure according to still other exemplary embodiments.

Referring to FIG. 9A, the first stress-relieving structure 115 may be provided on the first semiconductor chip 110 and have a tetragonal or rectangular shape. The first semiconductor chip 110 may have four corners exposed by the second semiconductor chip 120, and the first stress-relieving structure 115 may be provided on at least one of the exposed four corners. In some modified exemplary embodiments, the first stress-relieving structure 115 may have a polygonal shape, when viewed in plan view.

Figure 9B:
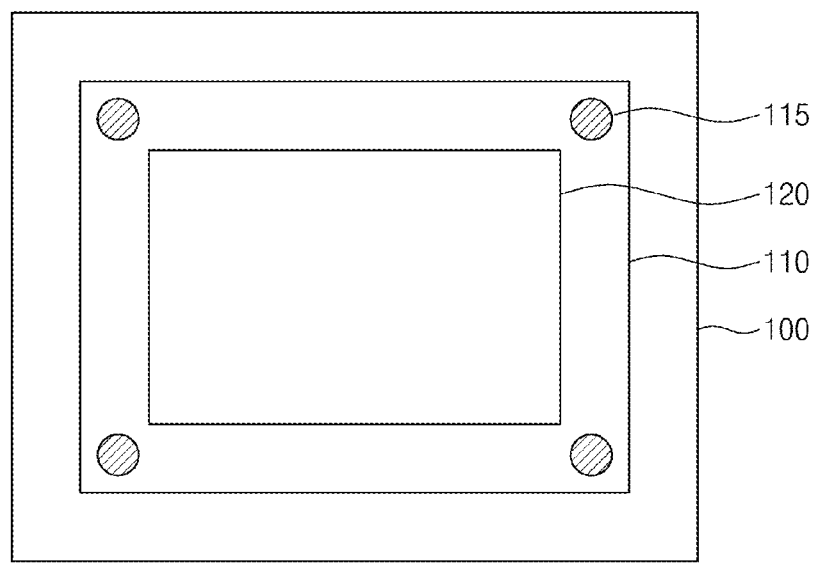

Referring to FIG. 9B, the first stress-relieving structure 115 may be provided on the first semiconductor chip 110 and have a curved or circular shape. The first semiconductor chip 110 may have four corners exposed by the second semiconductor chip 120, and the first stress-relieving structure 115 may be provided on at least one of the exposed four corners. In some modified exemplary embodiments, the first stress-relieving structure 115 may have an elliptical shape, when viewed in plan view.

Figure 9C:
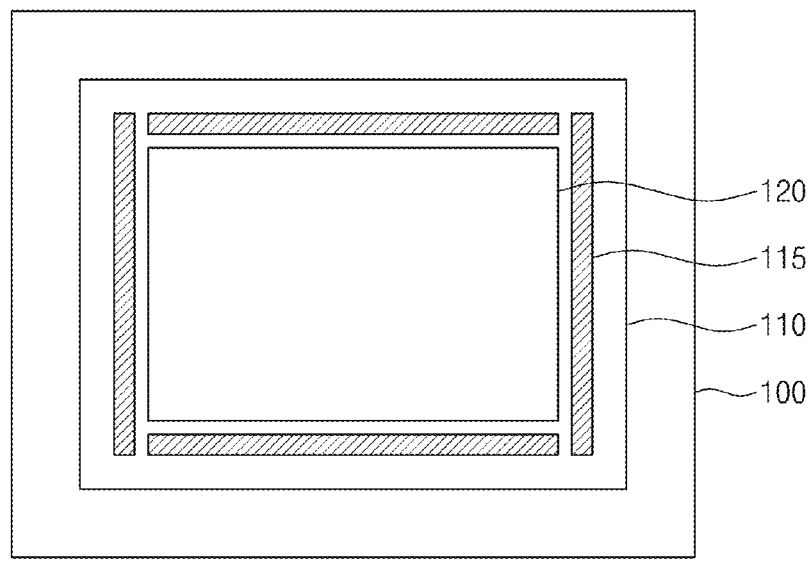

Referring to FIG. 9C, the first stress-relieving structure 115 may be provided on the first semiconductor chip 110 and be a line-shaped structure extending along the edge of the first semiconductor chip 110. The first semiconductor chip 110 may have a rectangular-ring-shaped edge exposed by the second semiconductor chip 120. The first stress-relieving structure 115 may include at least one line-shaped pattern extending from a corner of the rectangular-ring-shaped edge toward an adjacent corner thereof.

Figure 9D:
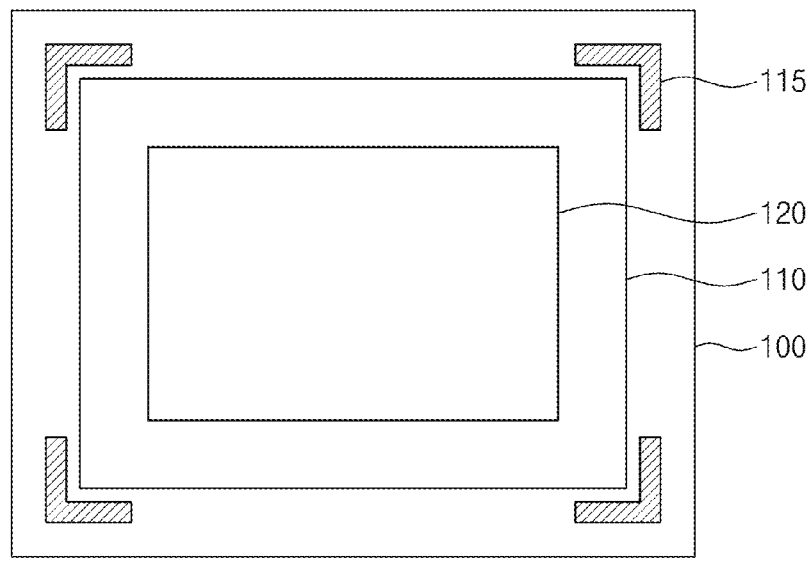

Referring to FIG. 9D, first stress-relieving structure 115 may be provided on the first semiconductor chip 110 and have an 'L'-shaped structure, when viewed in plan view. For example, the first semiconductor chip 110 may have a rectangular-ring-shaped edge exposed by the second semiconductor chip 120. The first stress-relieving structure 115 may be provided on at least one of the corners of the edge, at which two sides meet. In certain exemplary embodiments, the 'L'-shaped first stress-relieving structure 115 may be elongated toward one of the exposed corners of the first semiconductor chip 110.

Figure 9E:
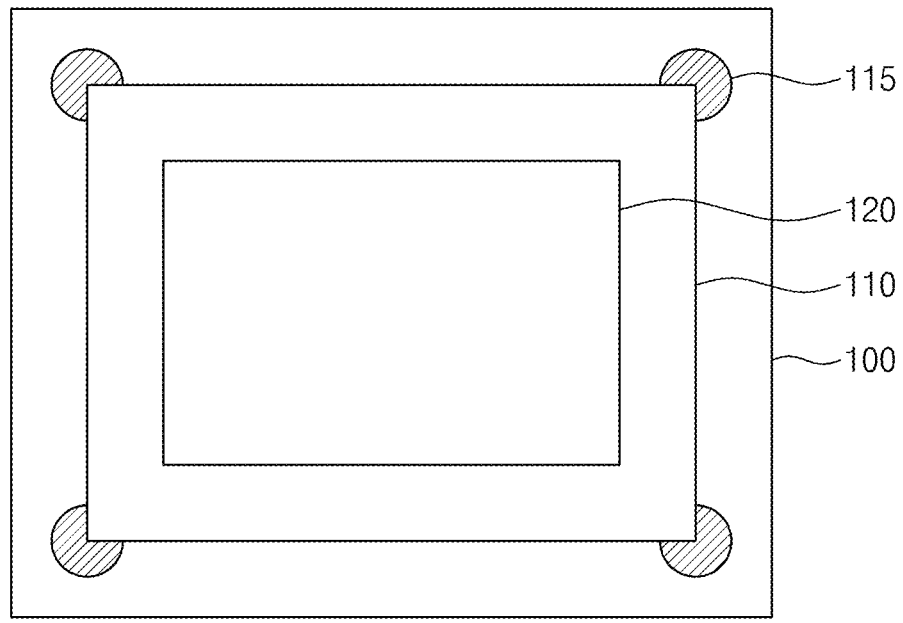

Referring to FIG. 9E, the first stress-relieving structure 115 may be provided at the corners of the first semiconductor chip 110. Unlike those of FIGS. 9A through 9D, the first stress-relieving structure 115 in the present exemplary embodiment may be provided on at least one of side surfaces of the corners of the first semiconductor chip 110, and thus, the first stress-relieving structure 115 may have a structure outward protruding from the first semiconductor chip 110. The first stress-relieving structure 115 may be provided to have a substantially circular shape. In some modified exemplary embodiments, the first stress-relieving structure 115 may have a polygonal and/or elliptical shape.

The first stress-relieving structure 115 of the semiconductor package may include at least one of combinations of several structures described with reference to FIGS. 9A through 9E. Further, exemplary embodiments are not limited to the specific structures of the first stress-relieving structure 115 described with reference to FIGS. 9A through 9E, and other structures and different combinations of the structures shown in FIGS. 9A through 9E are contemplated.

Figure 10A:
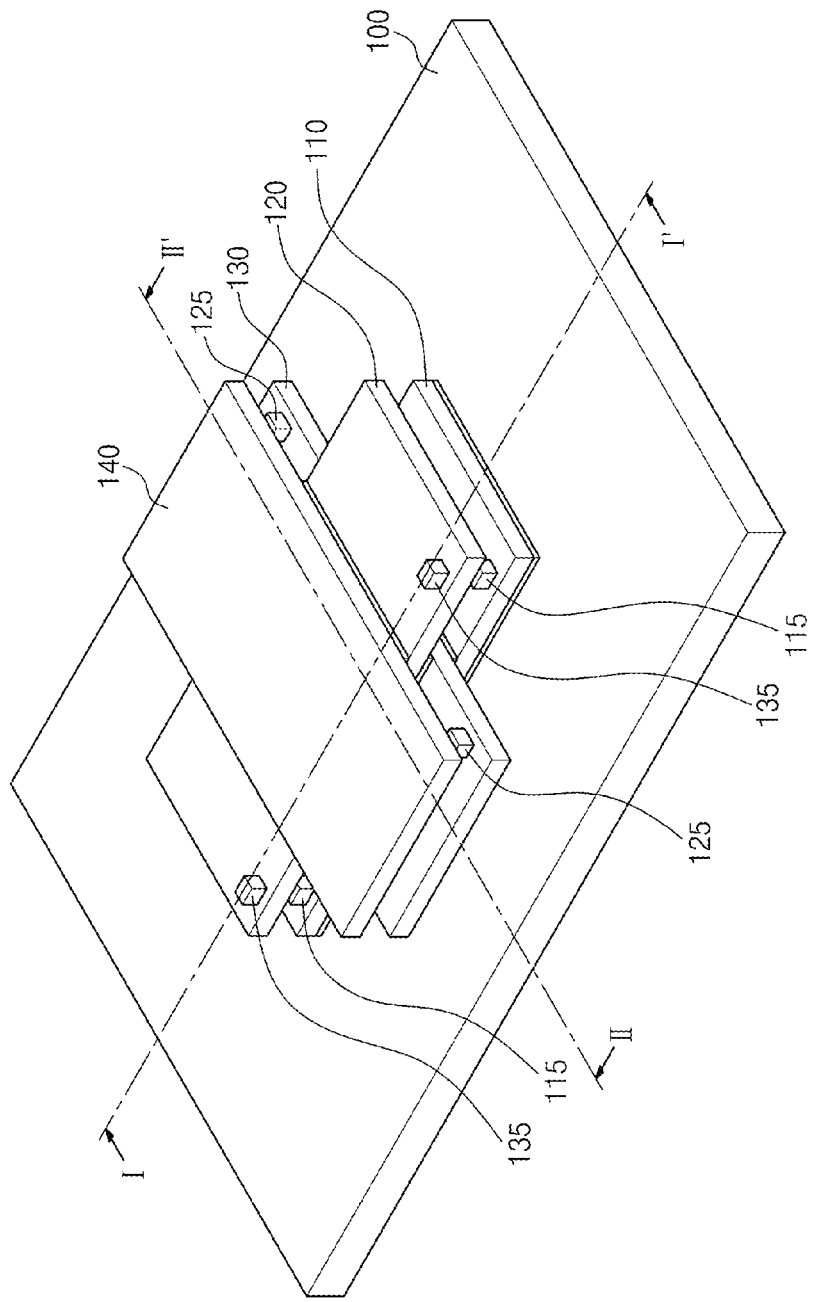
FIG. 10A is a perspective view illustrating a semiconductor package according to yet other exemplary embodiments.
Figure 10C:
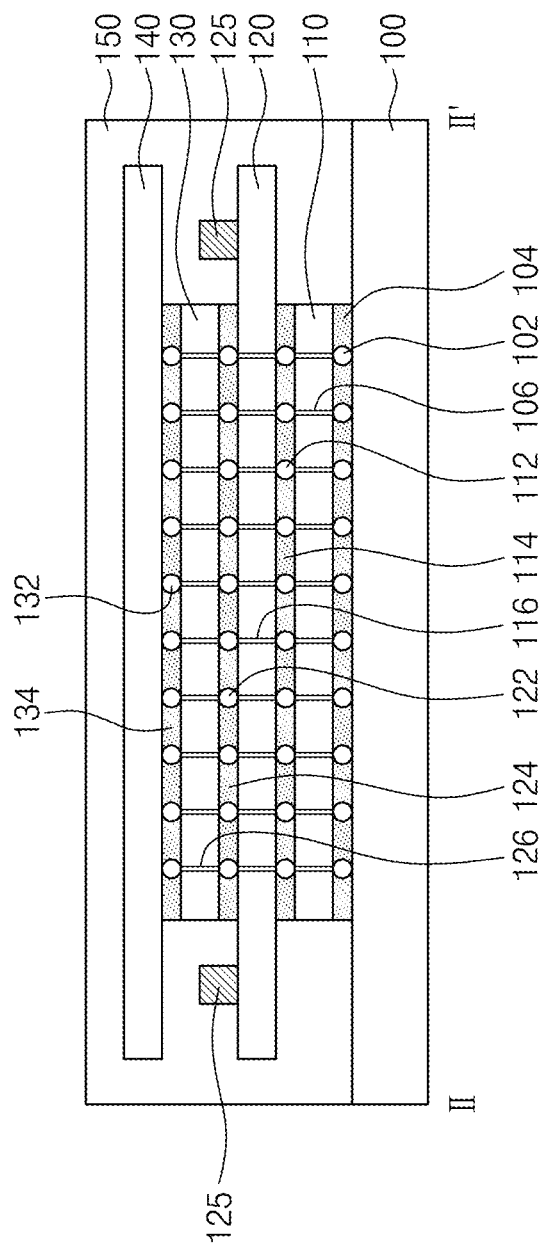
FIG. 10C is a sectional view of the semiconductor package taken along a line II-II' of FIG. 10A.

FIG. 10A is a perspective view illustrating a semiconductor package according to yet other exemplary embodiments, and FIG. 10B is a sectional view of the semiconductor package taken along a line I-I' of FIG. 10A, and FIG. 10C is a sectional view of the semiconductor package taken along a line II-II' of FIG. 10A.

Referring to FIGS. 10A to 10C, a semiconductor package may include a package substrate 100, a plurality of semiconductor chips, which are vertically stacked on the package substrate 100, and a mold layer 150 covering the package substrate 100 and the semiconductor chips.

As shown in FIG. 10A, the semiconductor chips 110, 120, 130, and 140 may have substantially the same size or area. The semiconductor chips 110, 120, 130, and 140 may be stacked one on another in a zigzag manner. For example, the first semiconductor chip 110 may be stacked on the package substrate 100, and the second semiconductor chip 120 may be rotated 90 degrees and leftward moved with respect to the first semiconductor chip 110 and stacked on the first semiconductor chip 110 to expose a right portion of the first semiconductor chip 110. The third semiconductor chip 130 may be rotated 90 degrees and rightward moved with respect to the second semiconductor chip 120 and stacked on the second semiconductor chip 120 to expose a left portion of the second semiconductor chip 120, and the fourth semiconductor chip 140 may be rotated 90 degrees and leftward moved with respect to the third semiconductor chip 130 and stacked on the third semiconductor chip 130 to expose a right portion of the third semiconductor chip 130. Referring to FIG. 10B, the first semiconductor chip 110 and the third semiconductor chip 130 may have a rightward protruding structure, and as shown in FIG. 10C, the second semiconductor chip 120 and the fourth semiconductor chip 140 may have a leftward protruding structure.

As further shown in FIGS. 10A, 10B and 10C, the semiconductor package may further include a first stress-relieving structure 115 disposed on the first semiconductor chip 110 and a second stress-relieving structure 125 disposed on the second semiconductor chip 120. A third stress-relieving structure 135 may be further provided on the third semiconductor chip 130.

The first stress-relieving structure 115 and the second stress-relieving structure 125 may be disposed to have a planar disposition similar to one of FIGS. 3A through 3E, and thus, for the sake of brevity, a description thereof will be omitted. Further, the semiconductor chips 110, 120, 130, and 140 may be provided to have the zigzag-stacked structure, as shown in FIGS. 10A, 10B and 10C, and in certain exemplary embodiments, the semiconductor chips 110, 120, 130, and 140 may be stacked to cross each other perpendicularly. Except for the difference associated with the stacking structure, the stress-relieving structure 125 may have a planar disposition substantially similar to that of FIGS. 3A through 3E, and thus, for the sake of brevity, a description thereof will be omitted.

In some modified exemplary embodiments, four semiconductor chips 110, 120, 130, and 140 having the same size may be stacked on the package substrate 100 to cross each other perpendicularly. For example, each of the semiconductor chips 110, 120, 130, and 140 may have a rectangular shape with two parallel long sides. The first semiconductor chip 110 may be stacked on the package substrate 100 in such a way that the long sides thereof are parallel to a first direction, and the second semiconductor chip 120 may be stacked on the first semiconductor chip 110 in such a way that the long sides thereof are perpendicular to the first direction or parallel to a second direction. The third semiconductor chip 130 may be stacked on the second semiconductor chip 120 in such a way that the long sides thereof are parallel to the first direction, and the fourth semiconductor chip 140 may be stacked on the third semiconductor chip 130 in such a way that the long sides thereof are parallel to the second direction. Here, the first to fourth semiconductor chips 110, 120, 130, and 140 may be stacked one on another in a concentric manner. The semiconductor package may further include a first stress-relieving structure 115 disposed on the first semiconductor chip 110 and a second stress-relieving structure 125 disposed on the second semiconductor chip 120. A third stress-relieving structure 135 may be further provided on the third semiconductor chip 130. The stress-relieving structure 125 may have a planar disposition substantially similar to that of one or more of FIGS. 9A through 9E, and thus, for the sake of brevity, a description thereof will be omitted.

Figure 11A:
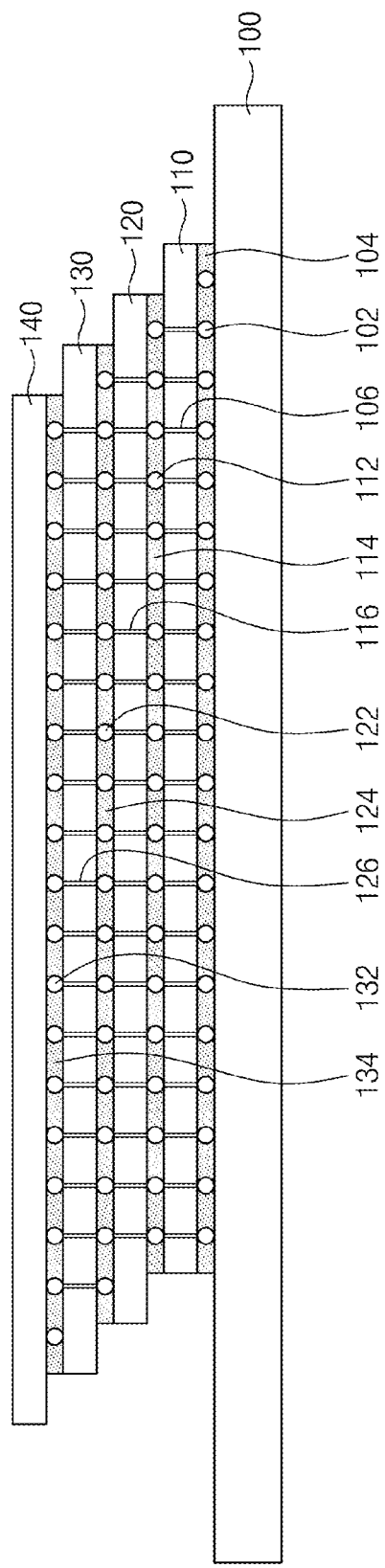
FIGS. 11A through 11C are sectional views illustrating a method of fabricating a semiconductor package, according to exemplary embodiments.
Figure 11B:
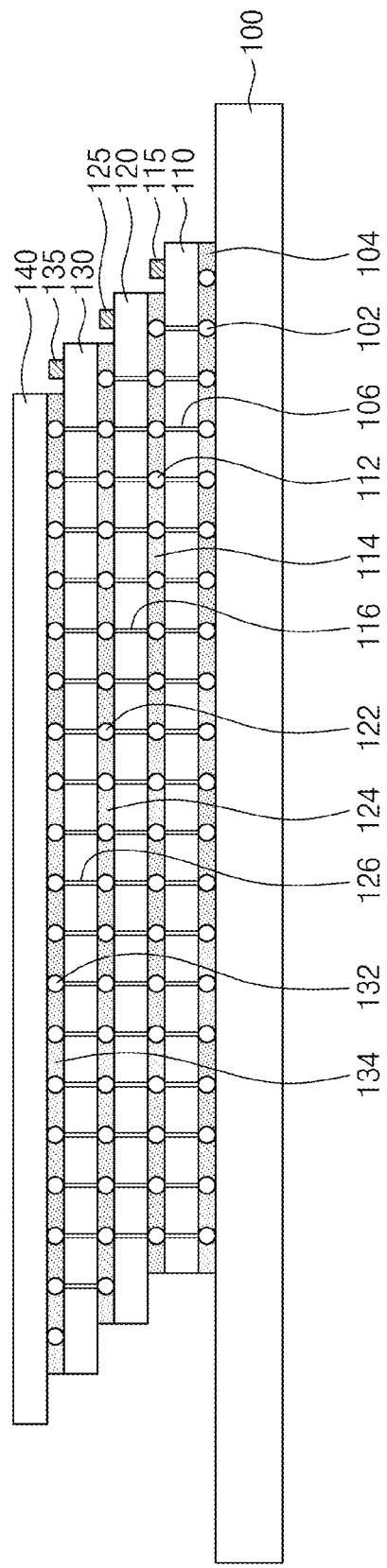
Figure 11C:
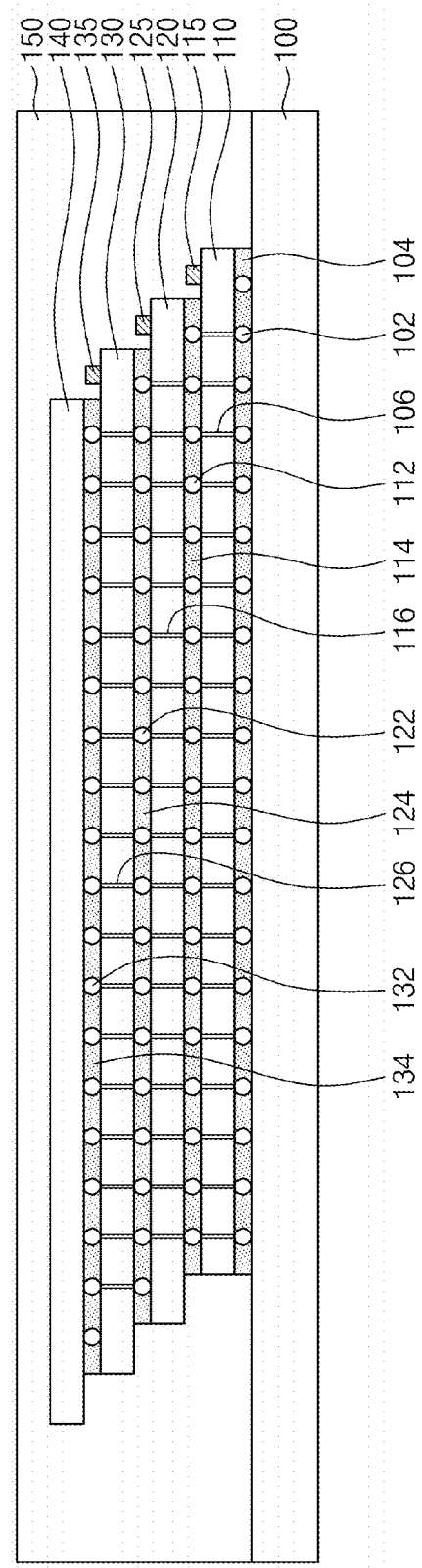

FIGS. 11A through 11C are sectional views illustrating a method of fabricating a semiconductor package, according to exemplary embodiments.

Referring to FIG. 11A, semiconductor chips may be sequentially mounted on a package substrate 100. According to the present exemplary embodiment, the semiconductor chips may be mounted on the package substrate 100 or an underlying one of the semiconductor chips in such a way that an upper chip thereof exposes at least a portion of another chip located thereunder. The number of the semiconductor chips may be four, and in this case, for the sake of description, the semiconductor chips will be sequentially referred to as a first semiconductor chip 110, a second semiconductor chip 120, a third semiconductor chip 130, and a fourth semiconductor chip 140, according to the stacking order of the semiconductor chips on the package substrate 100.

A process of mounting the first to fourth semiconductor chips 110, 120, 130, and 140 on the package substrate 100 may be performed using one of the related art processes known to a skilled person in this art.

Referring to FIG. 11B, first to third stress-relieving structures 115, 125, and 135 may be formed on the exposed edges of the first to third semiconductor chips 110, 120, 130, respectively.

The first to third stress-relieving structures 115, 125, and 135 may include a material of low modulus. For example, the first to third stress-relieving structures 115, 125, and 135 may include at least one of epoxy resin, polyimide, silicone, or rubber.

In some exemplary embodiments, the first to third stress-relieving structures 115, 125, and 135 may be formed by forming a material layer and then patterning the same. In other exemplary embodiments, the first to third stress-relieving structures 115, 125, and 135 may be attached to the first to third semiconductor chips 110, 120, and 130, respectively, using an adhesive material. However, the process of forming the first to third stress-relieving structures 115, 125, and 135 is not limited to the above-described processes.

Referring to FIG. 11C, a mold layer 150 may be formed to cover the package substrate 100, the first to fourth semiconductor chips 110, 120, 130, and 140, and the first to third stress-relieving structures 115, 125, and 135.

FIGS. 12A through 12D are sectional views illustrating a method of fabricating a semiconductor package, according to other exemplary embodiments.

Figure 12A:
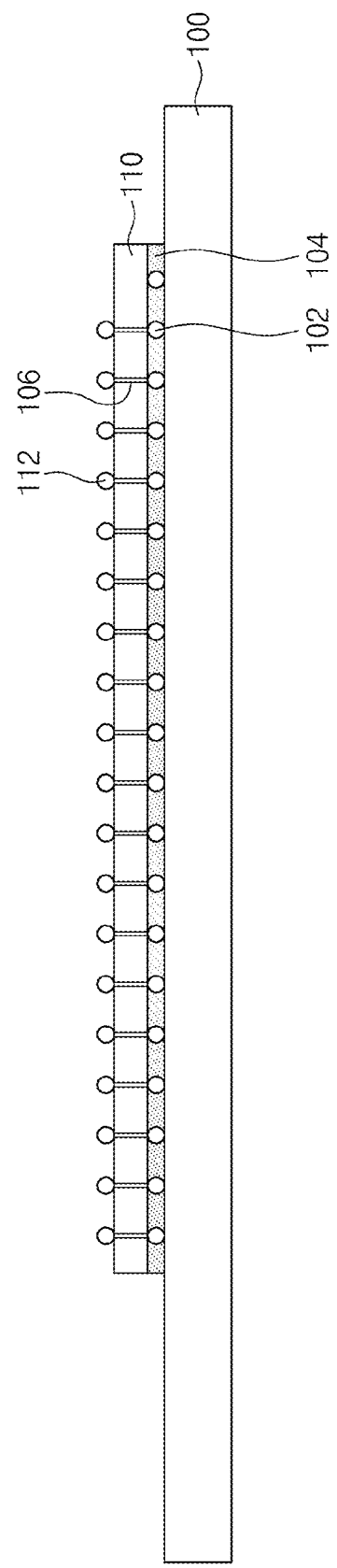
FIGS. 12A through 12D are sectional views illustrating a method of fabricating a semiconductor package, according to other exemplary embodiments.

Referring to FIG. 12A, first connection patterns 102 may be formed on a top surface of a package substrate 100, and second connection patterns 112 may be formed on a top surface of a first semiconductor chip 110. The first semiconductor chip 110 with the second connection patterns 112 may be mounted on the package substrate 100 with the first connection patterns 102.

In detail, the first connection patterns 102 may be in contact with a bottom surface of the first semiconductor chip 110, and a first under-fill layer 104 may be formed to fill a gap region between the first semiconductor chip 110 and the package substrate 100.

Figure 12B:
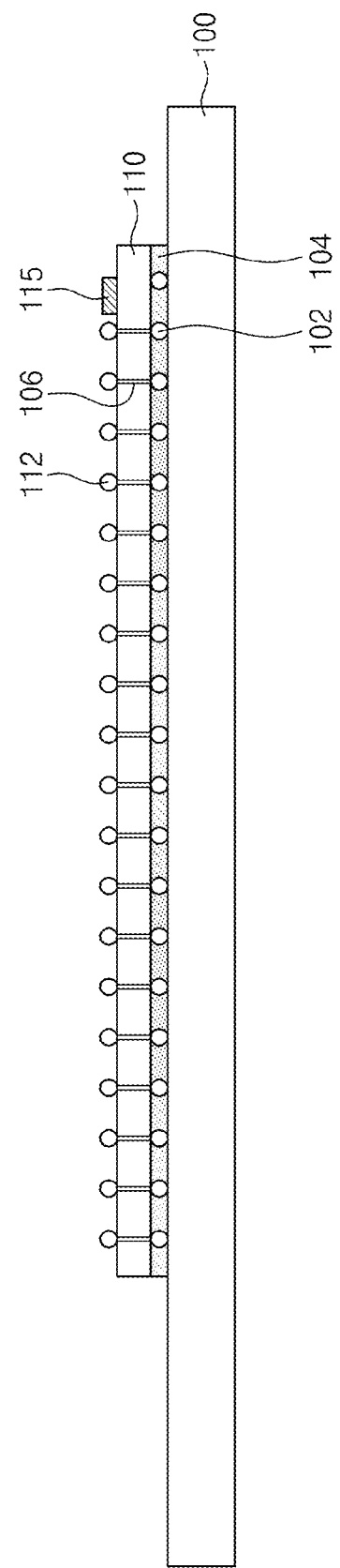

Referring to FIG. 12B, a first stress-relieving structure 115 may be formed on a top edge of the first semiconductor chip 110.

In some exemplary embodiments, the first stress-relieving structure 115 may be formed in such a way that at least a portion thereof is overlapped with a second semiconductor chip 120, which will be subsequently mounted on the first semiconductor chip 110. The at least portion of the first stress-relieving structure 115 may be protruded from an edge of the second semiconductor chip 120. The semiconductor packages of FIGS. 2B, 2C, 6B and 6C can be fabricated by repeatedly performing this process.

In other exemplary embodiments, the first stress-relieving structure 115 may be formed in such a way that the first stress-relieving structure 115 is wholly overlapped with the second semiconductor chip 120, which will be subsequently mounted on the first semiconductor chip 110. The semiconductor packages of FIGS. 2D, 2E, 6D and 6E can be fabricated by repeatedly performing this process.

Figure 12C:
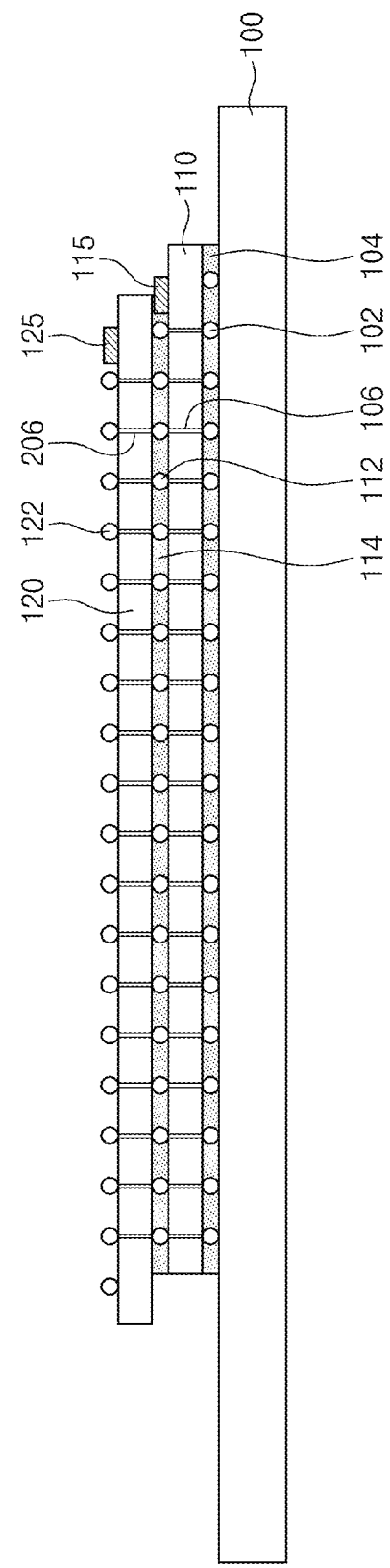

Referring to FIG. 12C, third connection patterns 122 may be formed on a top surface of a second semiconductor chip 120, and the second semiconductor chip 120 with the third connection patterns 122 may be mounted on the first semiconductor chip 110.

In detail, the second connection patterns 112 may be in contact with a bottom surface of the second semiconductor chip 120, and a second under-fill layer 114 may be formed to fill a gap region between the first and second semiconductor chips 110 and 120.

In some exemplary embodiments, the second under-fill layer 114 may be formed to cover at least a portion of the first stress-relieving structure 115. In other exemplary embodiments, the second under-fill layer 114 may be formed to cover wholly the first stress-relieving structure 115.

Figure 12D:
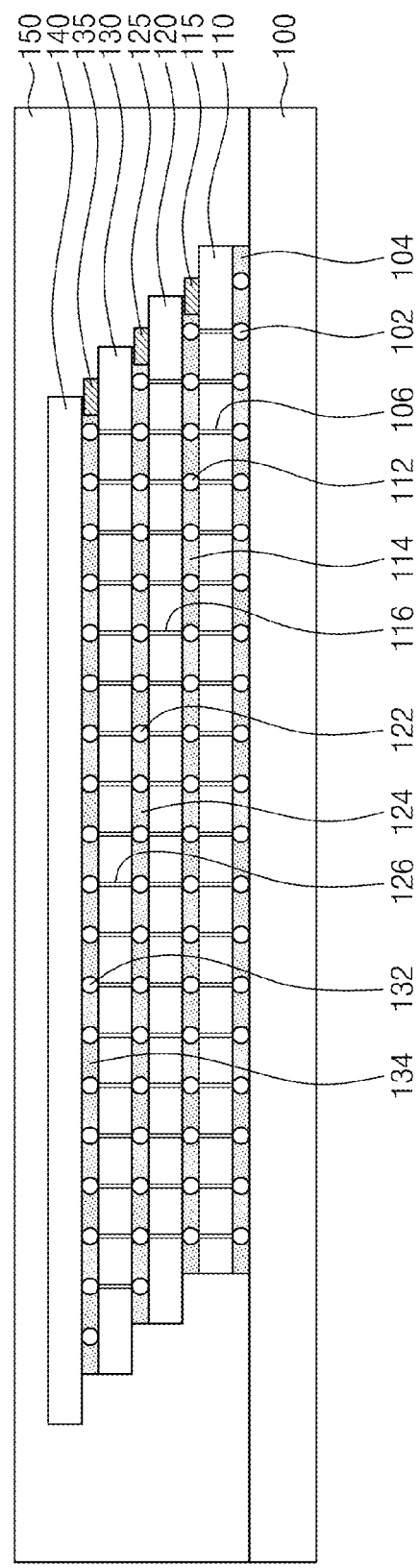

Referring to FIG. 12D, a third semiconductor chip 130, a third stress-relieving structure 135, and a fourth semiconductor chip 140 may be sequentially formed by adaptively performing the process described with reference to FIG. 12A and FIG. 12C. Thereafter, a mold layer 150 may be formed to cover the package substrate 100, the first to fourth semiconductor chips 110, 120, 130, and 140, and the first to third stress-relieving structures 115, 125, and 135.

The first to third stress-relieving structures 115, 125, and 135 may include a material of low modulus. For example, the first to third stress-relieving structures 115, 125, and 135 may include at least one of epoxy resin, polyimide, silicone, or rubber.

In some exemplary embodiments, the first to third stress-relieving structures 115, 125, and 135 may be formed by forming a material layer and then patterning the same. In other exemplary embodiments, the first to third stress-relieving structures 115, 125, and 135 may be attached to the first to third semiconductor chips 110, 120, and 130, respectively, using an adhesive material. In still other exemplary embodiments, the first to third stress-relieving structures 115, 125, and 135 may be formed on the first to third semiconductor chips 110, 120, and 130, respectively, using a tapered nozzle. However, the process of forming the first to third stress-relieving structures 115, 125, and 135 is not limited to the above-described processes.

Figure 13A:
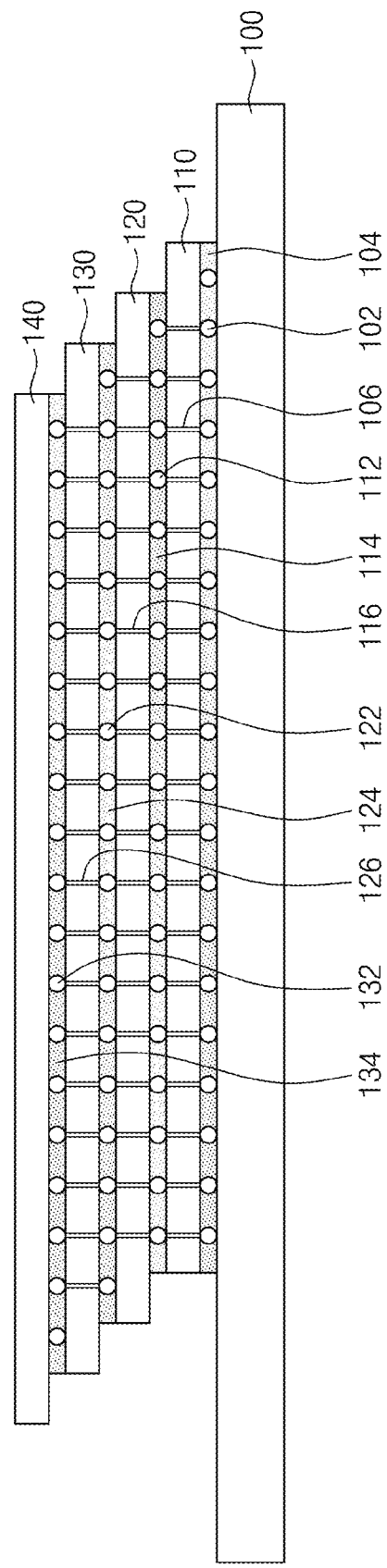
Figure 13C:
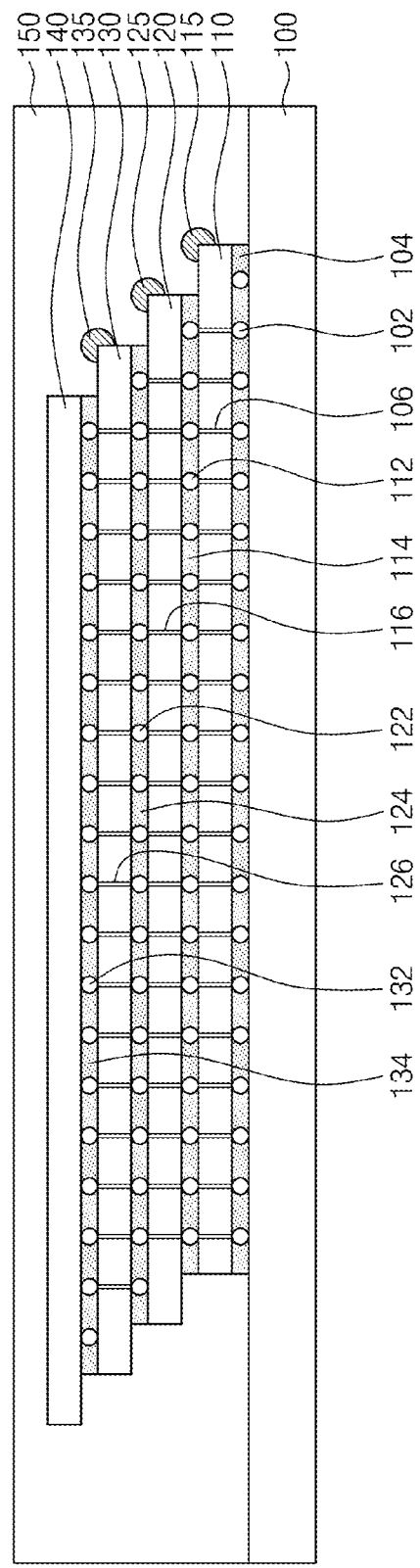

FIGS. 13A through 13C are sectional views illustrating a method of fabricating a semiconductor package, according to still other exemplary embodiments.

Referring to FIG. 13A, first to fourth semiconductor chips 110, 120, 130, and 140 may be sequentially mounted on a package substrate 100. A process of mounting the first to fourth semiconductor chips 110, 120, 130, and 140 on the package substrate 100 may be performed using one of the related art processes known to a skilled person in this art.

Referring to FIG. 13B, first to third stress-relieving structures 115, 125, and 135 may be formed on corners of the first to third semiconductor chips 110, 120, and 130, respectively.

The first to third stress-relieving structures 115, 125, and 135 may include a material of low modulus. For example, the first to third stress-relieving structures 115, 125, and 135 may include at least one of epoxy resin, polyimide, silicone, or rubber.

For example, the first stress-relieving structure 115 may be formed on the corner of the first semiconductor chip 110 using an apparatus with a tapered nozzle. The second and third stress-relieving structures 125 and 135 may be formed in the same manner using the same apparatus. However, the process of forming the first to third stress-relieving structures 115, 125, and 135 is not limited to the above-described process.

Referring to FIG. 13C, a mold layer 150 may be formed to cover the package substrate 100, the first to fourth semiconductor chips 110, 120, 130, and 140, and the first to third stress-relieving structures 115, 125, and 135.

According to exemplary embodiments of the inventive concept, when the portion of the bottom semiconductor chip is exposed by the top semiconductor chip, the exposed portion is vulnerable to cracking and failing. By forming the stress-relieving structure on the exposed portion, cracking and failing may be suppressed.

While exemplary embodiments of the inventive concepts have been particularly shown and described, it will be understood by one of ordinary skill in the art that variations in form and detail may be made therein without departing from the spirit and scope of the attached claims.

What is claims is:

1. A semiconductor package comprising:
   a package substrate;
   a first semiconductor chip mounted on the package substrate;
   a second semiconductor chip mounted on the first semiconductor chip to expose at least a portion of the first semiconductor chip;
   a stress-relieving structure provided at an edge of the first semiconductor chip and configured to relieve stress applied between the first semiconductor chip and the second semiconductor chip;
   connection patterns provided between the first semiconductor chip and the second semiconductor chip and connecting the first semiconductor chip and the second semiconductor chip electrically; and
   an under-fill layer provided between the first semiconductor chip and the second semiconductor chip and covering the connection patterns.

2. The semiconductor package of claim 1, wherein the stress-relieving structure comprises at least one of epoxy resin, polyimide, silicone, or rubber.

3. The semiconductor package of claim 1, further comprising a third semiconductor chip mounted on the second semiconductor chip and overlapped with the stress-relieving structure.

4. The semiconductor package of claim 1, wherein the stress-relieving structure is provided on the portion of the first semiconductor chip exposed by the second semiconductor chip.

5. The semiconductor package of claim 1, wherein at least a portion of the stress-relieving structure is overlapped with the second semiconductor chip and another portion is protruded from an edge of the second semiconductor chip.

6. The semiconductor package of claim 1, wherein the stress-relieving structure is provided below an edge of the second semiconductor chip and is wholly overlapped with the second semiconductor chip.

7. The semiconductor package of claim 1, wherein the stress-relieving structure is provided on a corner of the first semiconductor chip and protrudes outwardly from the first semiconductor chip.

8. The semiconductor package of claim 1, wherein the stress-relieving structure is provided on a corner of the first semiconductor chip exposed by the second semiconductor chip.

9. The semiconductor package of claim 1, wherein the stress-relieving structure comprises a line-shaped structure extending along an edge of the first semiconductor chip exposed by the second semiconductor chip.

10. The semiconductor package of claim 1, wherein the stress-relieving structure comprise an 'L'-shaped structure disposed at a corner at which two sides of the first semiconductor chip exposed by the second semiconductor chip meet.

11. The semiconductor package of claim 1, wherein the stress-relieving structure is provided on the portion of the first semiconductor chip exposed by the second semiconductor chip and is spaced apart from the under-fill layer.

12. The semiconductor package of claim 1, wherein the stress-relieving structure is provided in the under-fill layer.

13. The semiconductor package of claim 1, wherein the stress-relieving structure comprises at least a portion provided in the under-fill layer and another portion extending outward beyond the second semiconductor chip.

14. The semiconductor package of claim 1, further comprising a mold layer covering the package substrate and the first semiconductor chip and the second semiconductor chip.

15. The semiconductor package of claim 1, wherein a top surface of the stress-relieving structure is lower than a top surface of the second semiconductor chip.

16. A semiconductor package comprising:
    a package substrate;
    a first semiconductor chip disposed on the package substrate;
    a second semiconductor chip disposed on the first semiconductor chip and exposing an exposed portion of a surface of the first semiconductor chip; and
    a stress-relieving structure disposed on the exposed portion or on a portion of the surface of the first semiconductor chip adjacent to the exposed portion and configured to relieve stress applied between the first semiconductor chip and the second semiconductor chip;
    wherein a top surface of the stress-relieving structure is lower than a top surface of the second semiconductor chip,
    the exposed portion of the surface of the first semiconductor chip extends from an edge of the first semiconductor chip to an edge of the second semiconductor chip, and
    the stress-relieving structure is disposed on a corner of the first semiconductor chip and extends over a portion of the exposed portion and a portion of a side surface of the first semiconductor chip.

17. The semiconductor package of claim 16, wherein the exposed portion of the surface of the first semiconductor chip extends from an edge of the first semiconductor chip to an edge of the second semiconductor chip, and
    the stress-relieving structure is disposed on the surface of the first semiconductor chip and extends along the surface of the first semiconductor chip on either side of the edge of the second semiconductor chip.

* * * * *